(12) United States Patent
Hasebe et al.

(10) Patent No.: US 7,425,762 B2
(45) Date of Patent: Sep. 16, 2008

(54) ELECTRONIC APPARATUS

(75) Inventors: Takehiko Hasebe, Yokohama (JP);
Takehide Yokozuka, Yokohama (JP);
Nobuyuki Ushifusa, Yokohama (JP);
Masahide Harada, Yokohama (JP); Eiji Matsuzaki, Yokohama (JP); Hiroshi Hozoji, Hitachiohta (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/607,910

(22) Filed: Dec. 4, 2006

(65) Prior Publication Data
US 2007/0080447 A1 Apr. 12, 2007

Related U.S. Application Data

(63) Continuation of application No. 10/844,392, filed on May 13, 2004, now Pat. No. 7,145,231, which is a continuation of application No. 10/147,073, filed on May 17, 2002, now Pat. No. 6,744,135.

(30) Foreign Application Priority Data

May 22, 2001 (JP) ............................. 2001-151818

(51) Int. Cl.
 *H01L 23/34* (2006.01)
(52) U.S. Cl. .................... 257/712; 257/707; 257/720
(58) Field of Classification Search ............. None
See application file for complete search history.

(56) References Cited

U.S. PATENT DOCUMENTS 4,383,270 A * 5/1983 Schelhorn ............ 361/707
4,628,407 A 12/1986 August et al.
6,020,629 A 2/2000 Farnworth et al.
6,310,391 B1 10/2001 Nagasawa et al.
6,528,882 B2 3/2003 Ding et al.
6,545,353 B2 * 4/2003 Mashino ............... 257/724

FOREIGN PATENT DOCUMENTS

| EP | 0 981 268 | 2/2000 |
| JP | 06-169189 | 6/1994 |
| JP | A-6-169189 | 6/1994 |
| JP | A-7-326690 | 12/1995 |
| JP | 2000012723 A | 1/2000 |

OTHER PUBLICATIONS

Harper, *Electronic Packaging and Interconnection Handbook*, 1991, McGraw-Hill, 1.48,6.71-6.73.

* cited by examiner

*Primary Examiner*—Leonardo Andújar
(74) *Attorney, Agent, or Firm*—Antonelli, Terry, Stout & Kraus, LLP.

(57) ABSTRACT

The invention provides an electronic apparatus having a metal core substrate including a metal plate, an insulating layer formed on the metal plate and a conductive layer formed on the insulating layer, and an electronic part, and to which the conductive layer and a terminal of the electronic part are connected. In the electronic apparatus, a member having a high thermal conductivity is arranged so as to be in contact with both of the metal plate and the electronic part. Accordingly, a heat radiating property of the electronic apparatus is increased.

5 Claims, 26 Drawing Sheets

ELECTRONIC APPARATUS

CROSS-REFERENCE TO RELATED APPLICATIONS

This application is a Continuation of application Ser. No. 10/844,392, filed on May 13, 2004, now U.S. Pat. No. 7,145,231, which is a Continuation of application Ser. No. 10/147,073 filed on May 17, 2002, now U.S. Pat. No. 6,744,135, which claims priority from Japanese patent application No. 2001-151818, filed May 22, 2001, the contents of which are hereby incorporated by reference in their entirety.

BACKGROUND OF THE INVENTION

1. Field of the Invention

The present invention relates to a structure of an electronic apparatus provided with a metal core substrate mounting electronic parts thereon, and a manufacturing technique thereof.

It is necessary that the electronic apparatus provided with the electronic substrate is structured such as to generate no defect caused by a heat generation by the electronic parts. Accordingly, a heat cycle test is executed before shipping. In particular, in an electronic part for vehicle used such as an ECU or the like, it is affected by whether or not an LSI chip generates heat due to an engine on or off in addition to a temperature change within a vehicle body in accordance with a change of environment or the like, and it is necessary that the electronic part or the like stands against a thermal cycle (for example, −40 degrees to 120 degrees: environmental test general rule JAS0D001 of electronic device for motor vehicle) in a wide temperature range. In recent years, there is a tendency that the ECU is arranged close to the engine, that is, there is a tendency that an upper limit of the temperature range becomes higher. When being exposed to the thermal cycle mentioned above a performance of the electronic parts within the ECU becomes unstable, and a connection defect between the mounting substrate for the electronic parts and the electronic parts tends to be generated. That is, a high heat radiating performance is required in the electronic apparatus, and more particularly, a heat radiating performance which is more excellent than that of the general electronic part is required in the electronic part for vehicle use such as the ECU or the like.

A prior art relating to a structure of a general electronic apparatus taking into consideration heat generation of the electronic part mounted on the substrate includes JP-A-6-169189.

In this publication, there is described an electronic circuit board in which a pad for a heat radiating electrode connected to a ground via a through hole is formed on a printed circuit board having the ground in an inner layer, and the pad for the heat radiating electrode and the heat radiating electrode provided in a chip type heat generating part are mounted so as to align. The structure of the electronic circuit board secures a heat radiating performance of the printed circuit board by radiating a heat generated by the chip type heat generating part to the ground via the heat radiating electrode, the pad for the heat radiating electrode and the through hole.

Further, there is a metal core substrate as a substrate for general electronic parts, and there is JP-A-7-326690 as a prior art taking into consideration a heat radiating performance of the metal core substrate.

In this publication, there is described a matter that an internal wiring pattern is formed on the metal core substrate, an outer lead is connected to the internal wiring pattern, the internal wiring pattern is formed by processing a thin film, for example, etching a copper film or the like, and a portion on which a chip part of the metal core substrate on which the internal wiring pattern is formed is mounted is formed in a recess portion.

JP-A-6-169189 describes neither a heat radiating structure corresponding to a kind of a substrate nor a metal core substrate since a glass epoxy material is used as a core of the substrate. Further, since a ground terminal of a semiconductor part is also set to a fixed size in the same manner as the other signal terminals, it is not sufficient to secure a heat radiating performance.

Further, in JP-A-7-326690, since a metal core substrate is used, a heat diffusion efficiency of the substrate itself is improved, however, since an organic adhesive agent such as an epoxy resin or the like or an organic insulating layer such as a polyimide or the like is provided between the metal core substrate and the electronic part, a heat conductivity from the electronic part to the substrate is low. That is, it is not said that the heat conductivity from the electronic part to the mounting substrate is sufficiency considered.

Further, no consideration is given to a connection defect between a semiconductor part terminal and a wiring which is generated in the case of forming the wiring on the metal core substrate in accordance with the prior art and employing a flip chip type semiconductor part in the wired metal core substrate.

Further, no consideration is given to a heat radiating structure in the case of mounting an electronic substrate to the other substrate as an interposer or the case of a multi chip module (MCM) in which a plurality of chips are mounted.

SUMMARY OF THE INVENTION

An object of the present invention is to improve a heat radiating performance of an electronic substrate by using a structure of a metal core substrate and to improve a heat radiating performance (heat resistance) of a whole of the electronic parts.

Further, another object of the present invention is to improve a heat radiating performance (heat resistance) of a whole of electronic parts having a substrate mounting an interposer thereon and a substrate employing the MCM structure.

One of the aspects in accordance with the present invention includes an electronic apparatus comprising:

a metal core substrate provided with a core member constituted by a metal plate or a complex metal plate and a wiring layer formed on the core member; and an electronic part having a terminal connected to the wiring layer, wherein a high heat conducting member is arranged so that the core member and the electronic part are adjacent to each other via the high heat conducting member.

In accordance with the structure mentioned above, a heat radiating performance of the electronic apparatus is improved.

Further, in the case of using the substrate mentioned above for an interposer (which means a substrate mounted to the other substrate), the electronic apparatus is preferably structured such that the high heat conducting member is arranged so that the other substrate to which the interposer is mounted and the high heat generation electronic part are in contact with each other via the high heat conducting member, or such that the high heat conducting member is arranged so that the other substrate to which the interposer is mounted and a metal plate constituting the substrate used as the interposer are in contact with each other via the high heat conducting member.

In this case, when using an iron series alloy containing at least any one of nickel, chrome, cobalt and aluminum, an iron series composite material obtained by applying a copper clad to the iron series alloy, tungsten, copper, molybdenum, tantalum, nickel, aluminum or the like, for the metal plate mentioned above, it is possible to provide with a high heat conducting property and a high rigidity. For example, as shown in Table 1, when using the copper or the aluminum, not only it is possible to manufacture inexpensively, but also the heat conductivity is high, so that an improved heat radiation can be achieved. Further, in the case that the main substrate is set to a substrate employing a ceramic such as an alumina, a glass ceramic or the like, since an inbar (iron-36 wt % nickel alloy) or 42 alloy (iron-42 wt % nickel alloy) has a high elasticity and a low coefficient of thermal expansion, it is possible to make a difference of thermal expansion coefficient between the interposer and the main substrate small by using a metal core interposer employing them, and it is possible to improve a solder connection reliability. In particular, an alloy having iron-nickel as a main component such as the inbar or the 42 alloy can be made an interposer having a coefficient of thermal expansion in correspondence to the kind of the main substrate, by changing a composition thereof, and it is possible to improve the solder connection reliability between the main substrate and the interposer.

TABLE 1

CANDIDATE MATERIAL FOR CORE METAL AND PHYSICAL PROPERTIES

| MATERIAL | ELASTIC MODULES (Gpa) | COEFFICIENT OF THERMAL EXPANSION (ppm/° C.) | COEFFICIENT OF THERMAL CONDUCTIVITY (W/m·K) |
| --- | --- | --- | --- |
| Invar | 141 | 1.2 | 10 |
| 42 ALLOY | 147 | 4.3 | 10 |
| Cu | 110 | 17 | 385 |
| Al | 68 | 24 | 210 |

Further, in the case of using the high elastic metal having the iron-nickel as the main component mentioned above as the metal plate mentioned above, since they have a low coefficient of thermal conductivity, it is preferable that the structure is made such that a surface thereof is coated with a member having a high coefficient of thermal conductivity, for example, a copper plating (composite metal plate). This coating can be also effectively used at a time of executing a roughening process for improving an adhesion to an insulating resin.

In this case, the member having the high thermal conductivity mentioned above means a material having a high coefficient of thermal conductivity in comparison with a resin material such as an epoxy polyimide or the like (coefficient of thermal conductivity: 0.2 to 0.3 W/m·k), which are generally used as an insulating material of the wiring substrate, and it is preferable to employ at least one of Al, silver, gold, conductive resin, copper and solder or a material (coefficient of thermal conductivity: some W/m·k or more) obtained by combining them.

In particular, in the case of employing at least the solder for the connection, since it is possible to form by using a mounting step (reflow) of the electronic part, it is possible to simplify a process step.

Further, taking the mounting to the electronic part, it is desirable to form the metal (particularly, Al, silver or gold) electrode in the electronic part and make a structure so as to connect the electrode to the metal plate by the solder, the conductive resin or the like. In some cases, in order to achieve a low cost, it is possible to connect an electronic part which is not provided with a metal electrode only particularly used for connection, by a conductive resin such as a silver paste or the like, or an adhesive agent. In this case, the adhesive agent is not advantageous in view of a heat radiation.

Further, the conducive layer mentioned above may employ a foil made of stainless, nichrome, tungsten, aluminum or the like which is generally used in a multi-layer wiring substrate, however, is preferably a copper foil.

Further, as a method of forming a via hole for heat radiation, a drilling, a plasma application or a photolithography of a resin in which a photosensitive material is mixed may be employed, however, a process in accordance with a laser beam is desirable. It is possible to form by using a CO2 laser, an ultraviolet laser, an Xe laser, an excimer laser, a YAG laser, a YLF laser, an Ar laser or the like having a high energy output, as the laser, however, it is preferable to form by the CO2 laser or the ultraviolet laser. In particular, since the ultraviolet laser has a characteristic of resolving the resin without carbonizing so as to form a via hole having a fine diameter, it is possible to prevent an unnecessary contact between the member having the high thermal conductivity and the signal wiring. Further, when using the drilling, it is possible to reduce a manufacturing cost.

It is preferable to use any of copper, tin, solder, nickel, chrome, gold and composite material thereof, for plating of the wire forming method employed in the present invention.

A method of connecting the electronic part and the metal plate in the substrate via the via hole for heat radiation employed in the present invention includes a method of connecting in accordance with a metal plating, a method of applying and charging a conductive material (a resin, an adhesive agent, a conductive resin or the like obtained by mixing a metal filler) to the via hole, a method of charging the solder and the like.

Other objects, features and advantages of the invention will become apparent from the following description of the embodiments of the invention taken in conjunction with the accompanying drawings.

DESCRIPTION OF THE PREFERRED EMBODIMENT

A description will be in detail given below of embodiments in accordance with the present invention.

Embodiment 1

Figure 1:
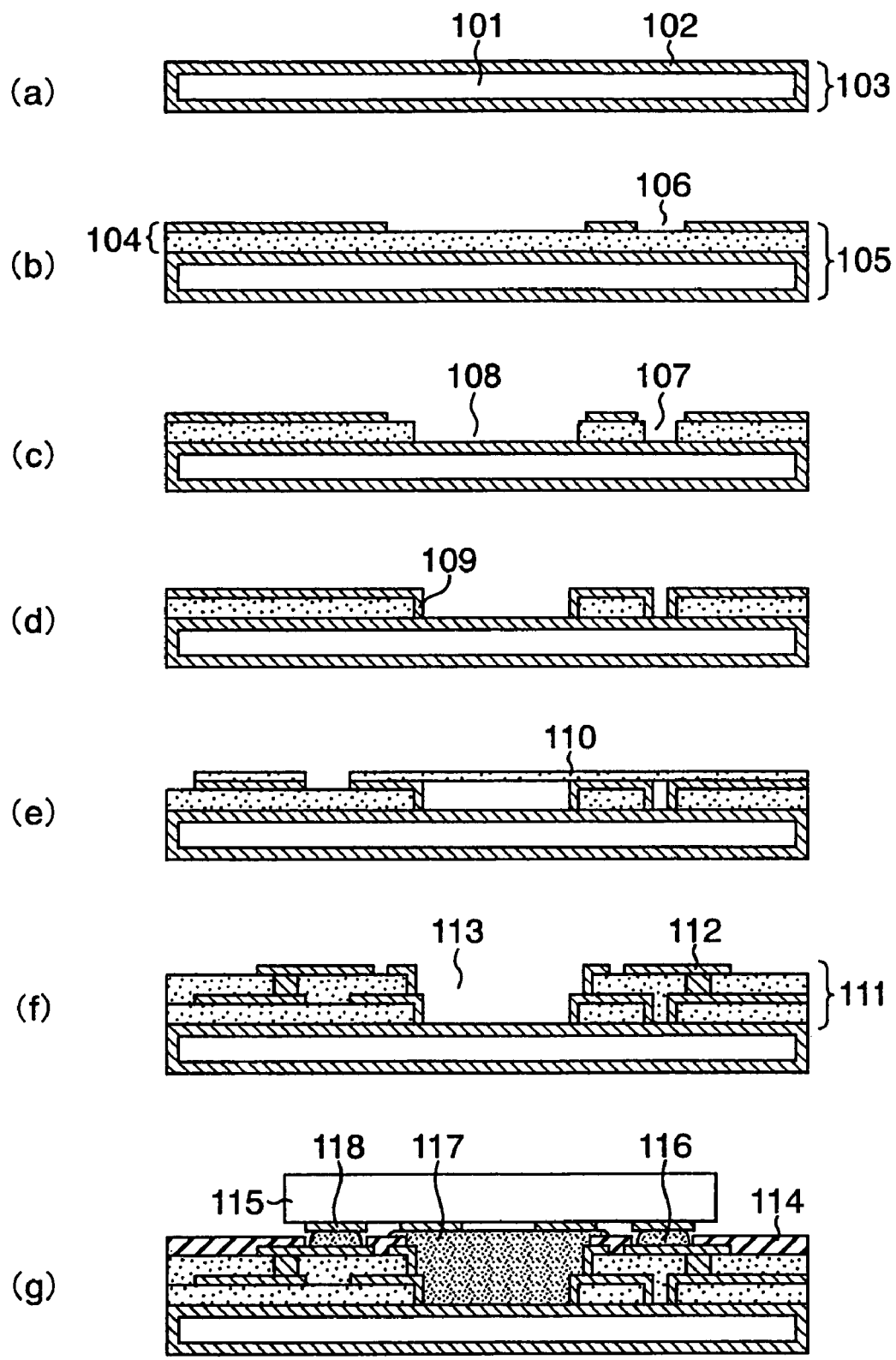
FIG. 1 is a view showing a manufacturing flow of an electronic substrate used in an electronic apparatus in accordance with the present invention.

FIG. 1 is a view showing a manufacturing flow of an electronic substrate used in an electronic apparatus in accordance with the present invention.

At first, a description will be given of an example of the electronic substrate manufactured by the present embodiment on the basis of a step (g) in FIG. 1.

The electronic substrate in accordance with the present embodiment is constituted by a composite metal plate 103 corresponding to a core member provided with a metal plate 101 (42 alloy having a thickness of 0.2 mm) and a roughened plated layer 102 covering a surface of the metal plate 101, a wiring layer 104 constituted by an epoxy resin (about 80 μm thickness) corresponding to an insulating layer, a copper foil (about 18 μm thickness) corresponding to a conductive layer layered and bonded by the epoxy resin and a via hole 107 open to the epoxy resin and disposed on the composite metal plate 103, a heat radiating via hole 108 (113), a thick copper plating 109, a solder resist 114, a semiconductor part 115 having an external terminal 118 (any one of Ag, Au and aluminum, however, in the present embodiment, Au), a heat radiating electrode 117 (Au), and a solder 116, and a solder corresponding to one of the member having the high thermal conductivity is formed so as to be charged into the heat radiating via hole 113 and be in contact with the composite metal plate 103 and the heat radiating electrode 117.

Since the member having the high thermal conductivity constituted by two layers comprising the heat radiating electrode 117 formed in the other area than the external terminal 18 of the semiconductor part and the solder charged in the heat radiating via hole 113 diffuses the heat generated from the semiconductor part 101 into the substrate, no heat is stored in a part of the electronic substrate, and it is possible to improve a heat radiating property of a whole of the electronic part.

Next, a description will be given of an example of the manufacturing method of the electronic substrate. The manufacturing method is executed by the following steps.

Step (a): 42 alloy (iron-42 wt % nickel alloy) having a thickness of 0.2 mm is prepared as the metal plate 101. A thermal conductivity is improved by applying the copper plating 102 to the 42 alloy of the metal plate 101. Further, the composite metal plate 103 is formed by roughening the surface of the copper plating 102.

Step (b): after the step (a), a resin (about 80 μm thickness) is applied onto one surface of the composite metal plate and the copper foil 104 having a thickness of about 18 μm is laminated and bonded thereto, whereby the metal core substrate 105 is formed. In this case, when laminating a pre-preg and a copper foil, a cost can be low. When using a resin coated copper foil (RCF), a laser piercing performance in the later step and an electric corrosion resistance after the substrate is finished are improved. So that it is advantageous in view of corresponding to a micro-fabrication.

Step (c): after the step (b), a part of the copper foil 106 in the metal core substrate 105 is removed, next the epoxy resin is dissolved and removed by an irradiation of CO2 laser, and thereafter, the heat radiating via hole 108 getting to the composite metal plate 103 and the via hole 107 for signal wiring are formed. Further, it is possible to form the via hole in accordance with the drilling, and in this case, the cost can be low.

Step (d): after the step (c), a removing process of resin residue is applied in accordance with a potassium permanganate method, and thereafter the thick copper plating 109 is precipitated by sequentially soaking into a light dipping chemical copper plating and an electric copper plating solution, and is conducted with the surface copper foil of the composite metal plate 103 via the via hole 107 and the is heat radiating via hole 108.

Step (e): after the step (d), an etching resist 110 is laminated on portions forming the wiring and the land portion on the surface copper foil, and a wiring layer 111 is formed in accordance with an etching using a ferric chloride.

Step (f): a multilayer wiring layer 111 is formed by repeating the steps (b) to (e) mentioned above. After forming the multilayer wiring layer, an electrode 112 forming a terminal of the substrate side wiring and the heat radiating via hole 113 are formed.

Step (g): the electrode (terminal) 112 of the substrate side wiring connected to the external terminal 118 (an external terminal in which a device itself is plated with gold or a gilded rewired terminal rewired from the terminal of the device itself) in the semiconductor part 115 is formed by laminating the solder resist 114 on the other area than the area in which the electrode 112 (the substrate side terminal) and the heat radiating via hole 113 are formed. Thereafter, the heat radiating electrode 117 insulated from the external terminal 118 formed on the other surfaces than the external terminal in the semiconductor part 115 is formed in the semiconductor part. Next, the solder is charged into the heat radiating via hole 113 between the heat radiating electrode 117 and the composite metal plate 103 slightly higher than the solder resist, and the solder is printed and formed between the external terminal 118 and the electrode 112.

Thereafter, the semiconductor part 115 is solder bonded to the substrate by mounting the semiconductor part and reflowing.

In accordance with the manufacturing method of the present embodiment, since the solder is used for connecting the heat radiating electrode 117 to the composite metal plate 103, it is possible to connect the heat radiating electrode 117 to the composite metal plate 103 in the reflow step which is used for connecting the external terminal 118 to the electrode 112, and it is possible to restrict an increase of step number.

Further, since the member having the high thermal conductivity is formed by two layers, it is possible to adjust a height of the member having the high thermal conductivity in the lower layer. Since it is possible to make the height of the external terminal 118 substantially equal to the height of the heat radiating electrode 117, it is possible to substantially mate conditions of reflow.

Further, since the copper film corresponding to the higher thermal conductive material than the metal plate (42 Alloy) is formed on the surface of the metal plate, it is possible to secure a high thermal radiating property. Further, since securing the heat radiating property is achieved by the copper film, and controlling the coefficient of thermal expansion is executed by the metal plate, it is possible to restrict the connection defect caused by the difference of coefficient of the thermal expansion between the substrate and the electronic part and a breakdown of the electronic part. Further, since the material having a high rigidity and a high elastic modulus is used for the metal plate, it is possible to prevent a through hole density from being reduced due to thinning of the core substrate, and an excellent handling property in manufacturing can be obtained.

In this case, when using an iron series alloy containing at least any one of nickel, chrome, cobalt and aluminum, an iron series composite material obtained by applying a copper clad to the iron series alloy, tungsten, copper, molybdenum, tantalum, nickel, aluminum or the like, for the metal plate mentioned above, it is possible to provide with a high heat conducting property and a high rigidity. For example, as shown in Table 1, when using the copper or the aluminum, not only it is possible to manufacture inexpensively, but also the heat conductivity is high, so that an improved heat radiation can be achieved. Further, in the case that the main substrate is set to a substrate employing a ceramic such as an alumina, a glass ceramic or the like, since an inbar having a high elastic modulus (iron-36 wt % nickel alloy) or 42 alloy (iron-42 wt % nickel alloy) has a low coefficient of thermal expansion, it is possible to make a difference of thermal expansion coefficient between the interposer and the main substrate small by using a metal core interposer employing them, and it is possible to improve a solder connection reliability. In particular, an alloy having iron-nickel as a main component such as the inbar or the 42 alloy can be made an interposer having a coefficient of thermal expansion in correspondence to the kind of the main substrate, by changing a composition thereof, and it is possible to improve the solder connection reliability between the main substrate and the interposer.

Further, in the case of using the high elastic metal having the iron-nickel as the main component mentioned above as the metal plate mentioned above, since they have a low coefficient of thermal conductivity, it is preferable that the structure is made such that a surface thereof is coated with a member having a high coefficient of thermal conductivity, for example, a copper plating (composite metal plate). This coating can be also effectively used at a time of executing a roughening process for improving an adhesion to an insulating resin.

In this case, the member having the high thermal conductivity mentioned above means a material having a high coefficient of thermal conductivity in comparison with a resin material such as an epoxy polyimide or the like (coefficient of thermal conductivity: 0.2 to 0.3 W/m·k), which are generally used as an insulating material of the wiring substrate, and it is preferable to employ at least one of Al, silver, gold, conductive resin, copper and solder or a material (coefficient of thermal conductivity: some W/m·k or more) obtained by combining them.

In particular, in the case of employing the solder for the connection, since it is possible to form by using a mounting step (reflow) of the electronic part, it is possible to simplify a process step.

Further, taking the mounting to the electronic part, it is desirable to form the metal (particularly, Al, silver or gold) electrode in the electronic part and make a structure so as to connect the electrode to the metal plate by the solder, the conductive resin or the like.

Further, the conducive layer mentioned above may employ a foil made of stainless, nichrome, tungsten, aluminum or the like which is generally used in a multi-layer wiring substrate, however, is preferably a copper foil.

Further, as a method of forming a via hole for heat radiation, a drilling, a plasma application or a photolithography of a resin in which a photosensitive material is mixed may be employed, however, a process in accordance with a laser beam is desirable. It is possible to form by using a CO2 laser, an ultraviolet laser, an Xe laser, an excimer laser, a YAG laser, a YLF laser, an Ar laser or the like having a high energy output, as the laser, however, it is preferable to form by the CO2 laser or the ultraviolet laser. In particular, since the ultraviolet laser has a characteristic of resolving the resin without carbonizing so as to form a via hole having a fine diameter, it is possible to prevent an unnecessary contact between the member having the high thermal conductivity and the signal wiring.

Figure 45A:
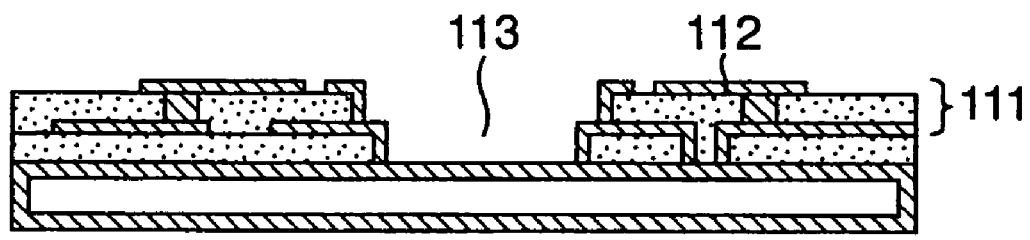
FIG. 45A is a view of a structure of a heat radiating via hole end surface in accordance with a step shown in FIG. 1.
Figure 45B:
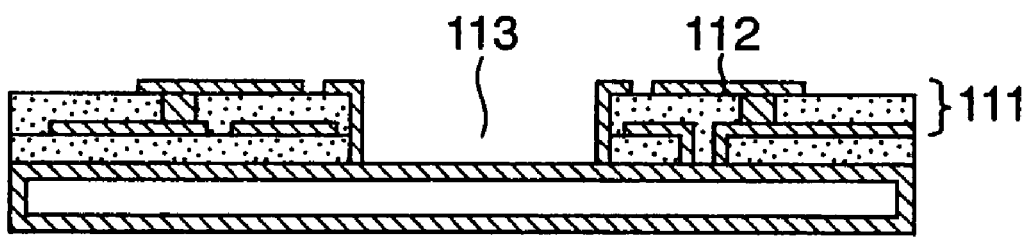
FIG. 45B is a view of a structure of the heat radiating via hole end surface in the case of executing a process of a plurality of insulating layers and wiring layers.

In forming the heat radiating via hole, it is possible to process a plurality of insulating layers and wiring layers in a lump. That is, since a counter sinking process 113 getting to a composite metal plate 103 from a surface of the substrate is executed in the step (f), and it is possible to omit a counter sinking process 108 in the step (c), it is possible to reduce a number of the steps so as to reduce a cost. A structure of an end surface of the heat radiating via hole at this time is shown in FIG. 45B, and a structure of the end surface of the heat radiating via hole in accordance with the step described in FIG. 1 is shown in FIG. 45A.

It is preferable to use any of copper, tin, solder, nickel, chrome, gold and composite material thereof, for plating of the wire forming method employed in the present invention.

A method of connecting the electronic part and the metal plate in the substrate via the via hole for heat radiation employed in the present invention includes a method of connecting in accordance with a metal plating, a method of applying and charging a conductive material (a resin, an adhesive agent, a conductive resin or the like obtained by mixing a metal filler) to the via hole, a method of charging the solder and the like.

Embodiment 2

Figure 2:
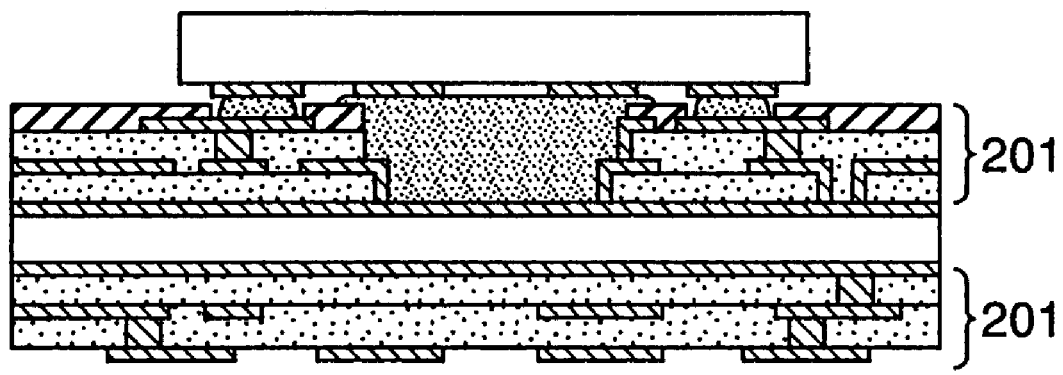
FIG. 2 is a view of a cross sectional structure of the electronic substrate used in the electronic apparatus in accordance with the present invention.

A description will be given of an embodiment 2 with reference to FIG. 2 corresponding to a cross sectional view of a structure of an electronic substrate.

The structure is the same as that of the embodiment 1 except that multilayer wiring layers 201 are laminated on both surfaces of the composite metal plate.

This structure is achieved by sequentially executing the steps (b) to (f) except the step of forming the heat radiating via hole in a surface of an opposite side of the substrate before the step (b) in the embodiment 1 and executing the steps (b) to (g) after reversing the substrate.

In the structure of this embodiment, since the structure of the metal core substrate is similar between the front and back surfaces, the coefficients of thermal expansion in the front and back surfaces become similar around the core member, so that a warpage of the substrate due to a bimetal effect is reduced. Therefore, in accordance with the present embodiment, it is possible to increase a connecting reliability between the external terminal in the semiconductor part and the electrode in the electronic substrate in comparison with the embodiment 1. Further, since it is possible to make the core member of the substrate thin, it is possible to reduce a weight of the substrate and it is possible to reduce a cost.

As described in the embodiment 1, when processing a plurality of insulating layers and wiring layers in a lump in forming the heat radiating via hole, it is possible to omit the counter sinking process 108 in the step (c), so that it is possible to reduce a number of the steps so as to reduce a cost. The structure of the end surface of the heat radiating via hole at this time is shown in FIG. 45B, and the structure of the end surface of the heat radiating via hole in accordance with the step described in FIG. 1 is shown in FIG. 45A.

Embodiment 3

Figure 3:
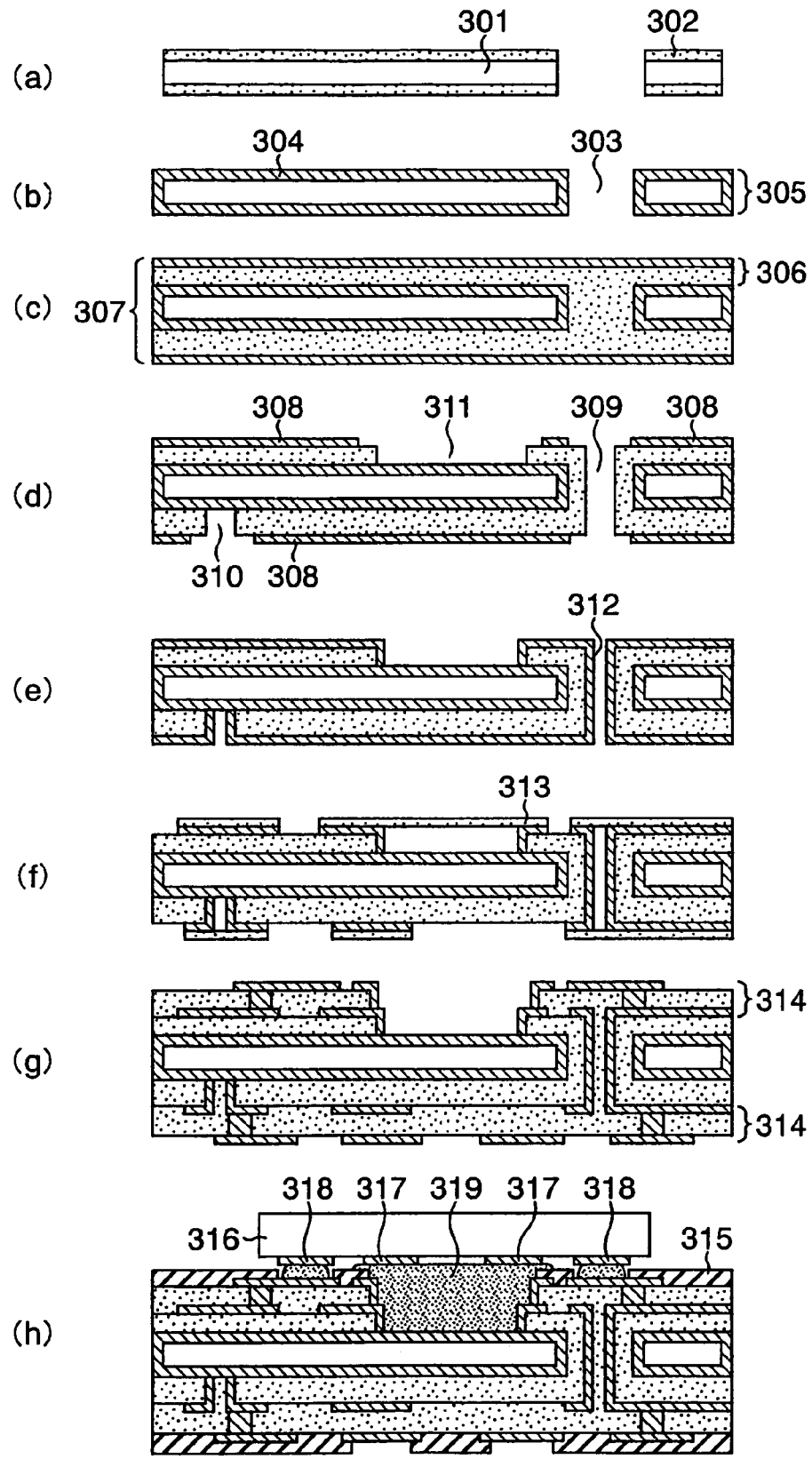
FIG. 3 is a view showing a manufacturing flow of the electronic substrate used in the electronic apparatus in accordance with the present invention.

A description will be given of an embodiment 3 with reference to FIG. 3 showing a manufacturing flow of an electronic substrate.

A structure in accordance with the embodiment 3 is different from the structure in accordance with the embodiment 2 in a point in which a window 303 is provided in a part of a complex metal plate 305 and the composite metal plate 305 is connected to a wiring layer formed on another surface by a copper plated through hole 312 formed by using the window.

A description will be given of a manufacturing method capable of manufacturing this structure with reference to (a) to (h) in FIG. 3.

Step (a): 42 alloy having a thickness of 0.1 mm is prepared as the metal plate 301. Next, an etching resist 302 is laminated on both surfaces of the metal plate, and the resist at a portion where the window 303 is formed is removed by exposing and developing from both surfaces. Further, the window 303 is formed in the metal plate in accordance with an etching process using a ferric chloride. The window is formed by arranging 0.2 mm² pieces in required portions at an interval of 0.4 mm.

Step (b): the composite metal plate is formed by applying a copper plating 304 to the metal plate so as to improve an electric conductivity. The surface of the copper plating is roughened after forming this.

Step (c): a copper foil with resin 306 or a resin pre-preg and a copper foil is individually laminated and bonded to both surfaces of the composite metal plate, whereby a metal core substrate 307 is formed.

Step (d): a through hole 309 extending through the window, a via hole 310 having a bottom in the composite metal plate and a heat radiating via hole 311 are formed by irradiating CO2 laser so as to dissolve and remove the epoxy resin after removing the surface copper foil 308 in the window 303 of the composite metal plate 301 and a part of the area not corresponding to the window.

Step (e): a removing process of resin residue is applied in accordance with a potassium permanganate method, and thereafter the thick copper plating 312 is precipitated by sequentially soaking into a light dipping chemical copper plating and an electric copper plating solution, and is conducted between the copper foils in the front and back surfaces of the substrate via the through hole 309, and between the composite metal plate and the copper foil on the topmost surface via the via hole 310 and the heat radiating via hole 311.

Step (f): an etching resist 313 is laminated on portions forming the electrode of the wiring in the substrate side and the land portion, and a first layer of wiring of a multilayer wiring layer 314 is formed in accordance with an etching using a ferric chloride.

Step (g): the multilayer wiring layer 314 is formed by repeating the steps (c) to (e).

Step (h): a solder resist 315 is formed in the other areas than a copper plating 319 charged into the wiring electrode (terminal) 308 of the substrate and the heat radiating via hole.

Next, a heat radiating electrode 317 is formed at the same height as that of the external terminal in the semiconductor part. Finally, an external terminal 318 of a semiconductor part 316 and the electrode (terminal) 308 of the substrate side wiring, and the heat radiating electrode 317 of the semiconductor part 316 and the copper plating 304 are connected by using a solder.

In accordance with the structure of the present embodiment, since it is possible to increase a freedom of connection between front and back wirings in comparison with the embodiment 2, a design freedom of wiring pattern is increased, and it is possible to mount electronic parts having a high performance and a multifunction.

As described in the embodiment 1, when processing a plurality of insulating layers and wiring layers in a lump in forming the heat radiating via hole, it is possible to omit the counter sinking process 108 in the step (c), so that it is possible to reduce a number of the steps so as to reduce a cost. The structure of the end surface of the heat radiating via hole at this time is shown in FIG. 45B, and the structure of the end surface of the heat radiating via hole in accordance with the step described in FIG. 1 is shown in FIG. 45A.

Embodiment 4

Figure 4:
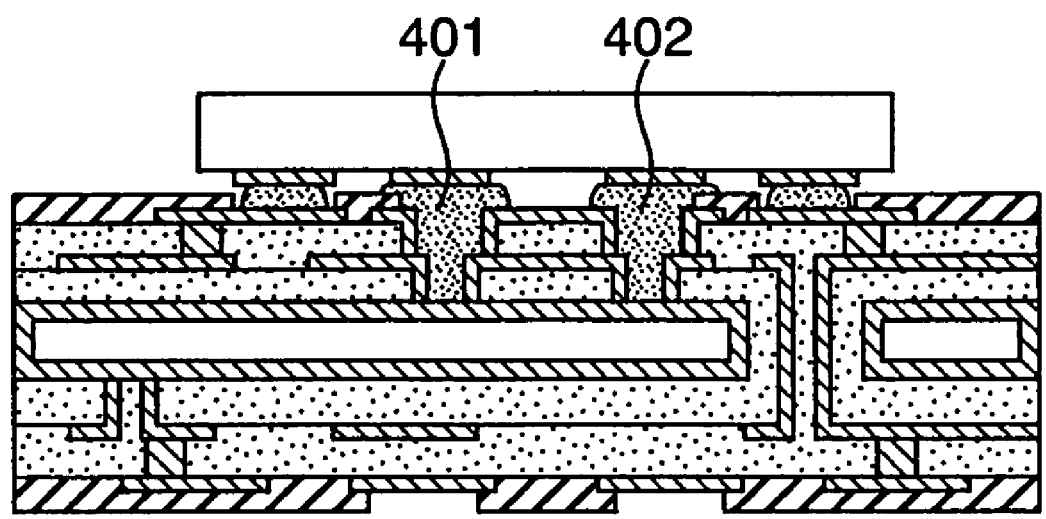
FIG. 4 is a view of a cross sectional structure of the electronic substrate used in the electronic apparatus in accordance with the present invention.

A description will be given of an embodiment 4 with reference to FIG. 4 corresponding to a cross sectional view of a structure of an electronic substrate.

A different point in a structure between the embodiment 4 and the embodiment 3 exists in a matter in which the member having the high thermal heat conductivity is charged into one heat radiating via hole 311 in accordance with the embodiment 3, on the contrary, two heat radiating via hole portions 401 and 402 are provided and the solder is charged in accordance with the embodiment 4.

Further, the structure in accordance with the present embodiment can be manufactured by using the steps of the embodiment 3, by separating the portion forming the heat radiating via hole in the steps (c) and (d) of the embodiment 3 into a plurality of numbers with using another mask.

In accordance with the structure of the present embodiment, since the forming method becomes easy by making a size of the individual heat radiating via hole small, it is possible to reduce a cost. Further, since it is possible to reduce a space which is used for a heat radiation path and can not be used for wiring or the like, it is possible to effectively use the substrate space, and it is possible to ease a wiring design rule.

As described in the embodiment 1, when processing a plurality of insulating layers and wiring layers in a lump in forming the heat radiating via hole, it is possible to omit the counter sinking process 108 in the step (c), so that it is possible to reduce a number of the steps so as to reduce a cost. The structure of the end surface of the heat radiating via hole at this time is shown in FIG. 45B, and the structure of the end surface of the heat radiating via hole in accordance with the step described in FIG. 1 is shown in FIG. 45A.

Embodiment 5

Figure 5:
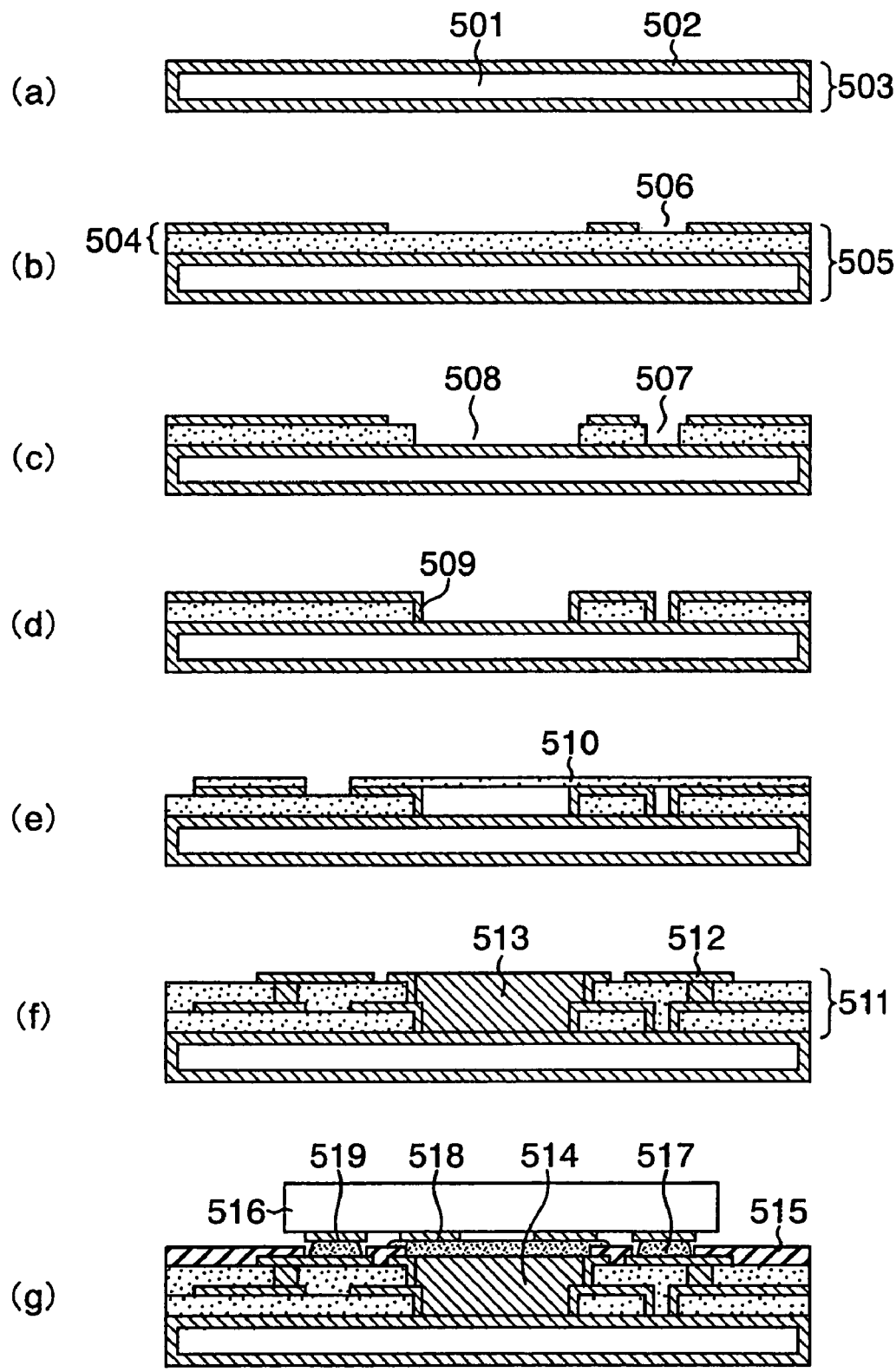
FIG. 5 is a view showing a manufacturing flow of the electronic substrate used in the electronic apparatus in accordance with the present invention.

A description will be given of an embodiment 5 with reference to FIG. 5 corresponding to a cross sectional view of a structure of an electronic substrate.

A difference from the structure in accordance with the embodiment 1 exists in a point in which a copper plating is charged into the solder layer below the heat radiating electrode 117 in FIG. 1 in place of the solder, and the copper plating and the heat radiating electrode are connected by the solder.

The structure is manufactured in accordance with the following steps.

Steps (a) to (f): the same as those in the embodiment 1.

Step (g): in the step (g) of the embodiment 1, the heat radiating via hole is charged by the solder, however, in the present embodiment, it is charged by the copper plating in place of the solder, and the surface of the substrate is flattened in accordance with a grinding operation after charging.

After the steps mentioned above, a solder resist 515 is laminated in the other area than the electrode (terminal) in the substrate side wiring and the copper plating. Thereafter, the copper which is charged into an external terminal 519 of a semiconductor part 516, an electrode 512 of the metal core substrate and a heat radiating electrode 518 of the semiconductor part 516, is connected by a solder 517.

In accordance with the structure of the present embodiment, since the heat radiating via hole is charged by the copper having a high thermal conductivity, it is possible to improve a heat radiating property of the electronic substrate. Further, by making the height of the insulating layer substantially coincide with the height of the heat radiating via hole, it is possible to improve a solder bonding property and it is possible to reduce a rate of generation of voids.

Further, since the charged copper is connected by the solder, it is possible to connect to the heat radiating electrode 518 in a reflow step of executing a connection between the external terminal 519 of the semiconductor part 516 and the electrode 512, so that it is possible to restrict a manufacturing cost.

As described in the embodiment 1, when processing a plurality of insulating layers and wiring layers in a lump in forming the heat radiating via hole, it is possible to omit the counter sinking process 108 in the step (c), so that it is possible to reduce a number of the steps so as to reduce a cost. The structure of the end surface of the heat radiating via hole at this time is shown in FIG. 45B, and the structure of the end surface of the heat radiating via hole in accordance with the step described in FIG. 1 is shown in FIG. 45A.

Embodiment 6

Figure 6:
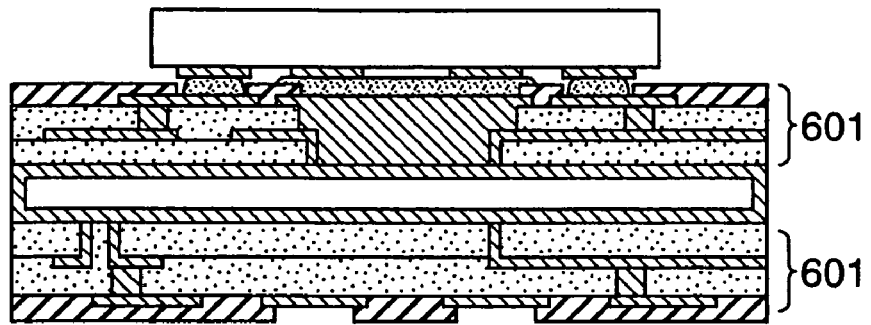
FIG. 6 is a view of a cross sectional structure of the electronic substrate used in the electronic apparatus in accordance with the present invention.

A description will be given of an embodiment 6 with reference to FIG. 6 corresponding to a cross sectional view of a structure of an electronic substrate.

The embodiment 6 has the same structure as that of the embodiment 5 except that laminated wiring layers are laminated on the other surface of the composite metal plate.

The structure in accordance with this embodiment can be manufactured by sequentially executing the steps (b) to (f) except the step of forming the heat radiating via hole in a surface of an opposite side of the substrate before the step (b) in the embodiment 5 and thereafter reversing the substrate.

In accordance with the structure of this embodiment, since the material structure of the metal core substrate is similar between the front and back surfaces, the coefficients of thermal expansion in the front and back surfaces become similar around the core member. Accordingly, it is possible to restrict a warpage of the substrate, and it is possible to increase a connecting reliability between the external terminal 519 in the semiconductor part and the electrode 512 in the substrate side wiring.

As described in the embodiment 1, when processing a plurality of insulating layers and wiring layers in a lump in forming the heat radiating via hole, it is possible to omit the counter sinking process 108 in the step (c), so that it is possible to reduce a number of the steps so as to reduce a cost. The structure of the end surface of the heat radiating via hole at this time is shown in FIG. 45B, and the structure of the end surface of the heat radiating via hole in accordance with the step described in FIG. 1 is shown in FIG. 45A.

Embodiment 7

Figure 7:
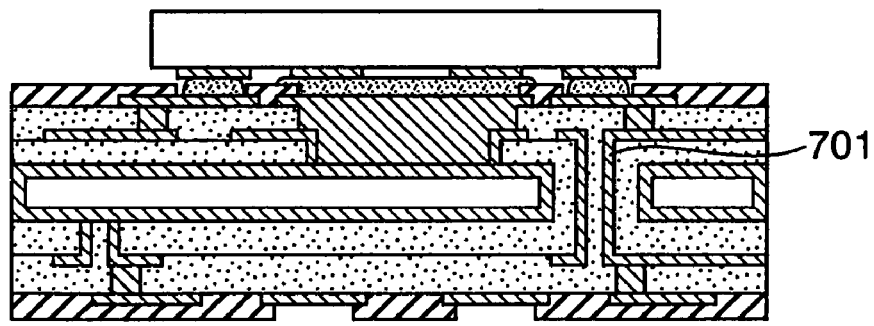
FIG. 7 is a view of a cross sectional structure of the electronic substrate used in the electronic apparatus in accordance with the present invention.

A description will be given of an embodiment 7 with reference to FIG. 7 corresponding to a cross sectional view of a structure of an electronic substrate.

The structure in accordance with the embodiment 7 is the same as the embodiment 6 except a matter that a via hole 701 extending through a window in which upper and lower wiring structure bodies of a metal plate are provided in the metal plate is provided. In this case, the through hole 701 is formed by using the step in accordance with the embodiment 3.

In accordance with the structure of the embodiment 7, since it is possible to make the via hole connecting the upper and lower wiring layers high density in comparison with the structure in accordance with the embodiment 6, it is possible to improve a wiring density of the substrate.

This structure can be manufactured by executing the step (a) of the embodiment 3 before the step (a) of the embodiment 6.

As described in the embodiment 1, when processing a plurality of insulating layers and wiring layers in a lump in forming the heat radiating via hole, it is possible to omit the counter sinking process 108 in the step (c), so that it is possible to reduce a number of the steps so as to reduce a cost. The structure of the end surface of the heat radiating via hole at this time is shown in FIG. 45B, and the structure of the end surface of the heat radiating via hole in accordance with the step described in FIG. 1 is shown in FIG. 45A.

Embodiment 8

Figure 8:
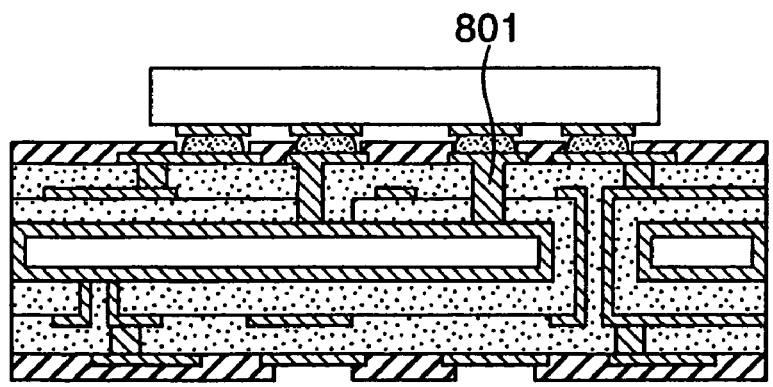
FIG. 8 is a view of a cross sectional structure of the electronic substrate used in the electronic apparatus in accordance with the present invention.

A description will be given of an embodiment 8 with reference to FIG. 8 corresponding to a cross sectional view of a structure of an electronic substrate.

A difference of a structure in accordance with the embodiment 8 from the structure in accordance with the embodiment 7 exists in a point that a heat radiating via hole 801 connected to the composite metal plate is separated into a plurality of pieces, a copper plating is charged into the via hole, and the copper plating is connected to the heat radiating electrode in the semiconductor part via the solder.

This structure can be manufactured by changing a removing pattern between the insulating layer and the conductive layer in the steps (b) to (g) of the embodiment 6.

In accordance with the structure of the embodiment 8, in comparison with the embodiment 7, it is possible to increase the space to which the wiring can be applied, and it is possible to make the area of the substrate small and it is possible to ease the wiring design rule. Further, it is possible to reduce the cost for forming the heat radiating via portion.

As described in the embodiment 1, when processing a plurality of insulating layers and wiring layers in a lump in forming the heat radiating via hole, it is possible to omit the counter sinking process 108 in the step (c), so that it is possible to reduce a number of the steps so as to reduce a cost. The structure of the end surface of the heat radiating via hole at this time is shown in FIG. 45B, and the structure of the end surface of the heat radiating via hole in accordance with the step described in FIG. 1 is shown in FIG. 45A.

Embodiment 9

Figure 9:
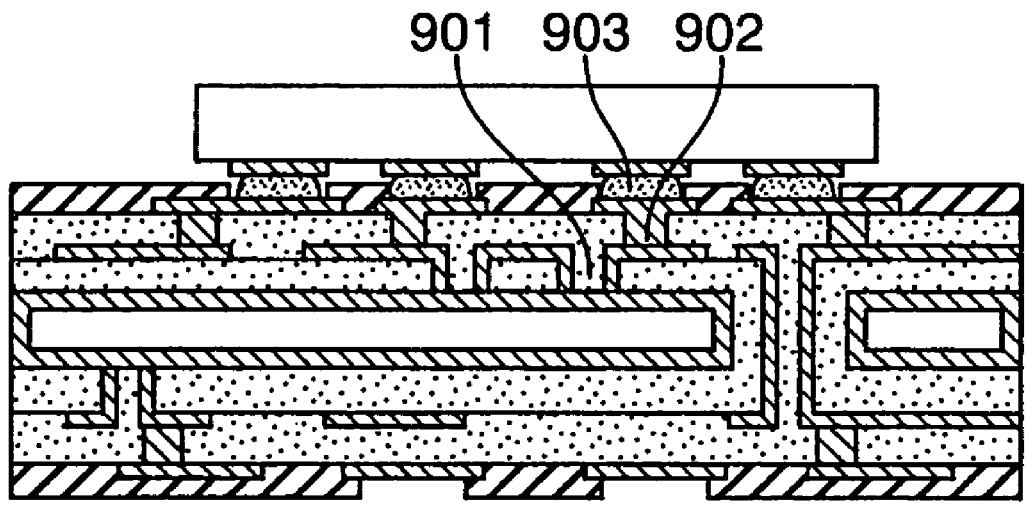
FIG. 9 is a view of a cross sectional structure of the electronic substrate used in the electronic apparatus in accordance with the present invention.

A description will be given of an embodiment 9 with reference to FIG. 9 corresponding to a cross sectional view of a structure of an electronic substrate.

A difference of a structure in accordance with the embodiment 9 from the structure in accordance with the embodiment 8 exists in a point that a first layer of wiring layer is formed in an area in which the first layer of via hole in the wiring layer is formed, in spite that the via hole 801 is formed from the topmost layer of the wiring layer to the composite metal plate, and a point that a second layer to the topmost layer in the via hole 801 constitute a via hole 901 charged with a copper plating 902.

In accordance with the structure of the embodiment 9, since the thermal conductivity in the heat radiating via hole portion is slightly inferior to the embodiment 8, however, it is possible to omit one time in the step of piercing the via hole, it is possible to reduce the cost.

Embodiment 10

Figure 10:
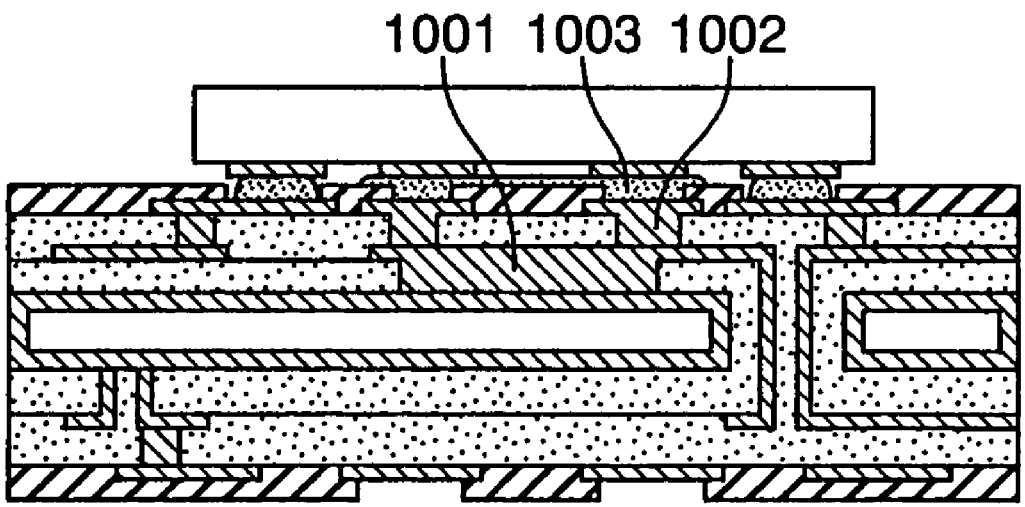
FIG. 10 is a view of a cross sectional structure of the electronic substrate used in the electronic apparatus in accordance with the present invention.

A description will be given of an embodiment 10 with reference to FIG. 10 corresponding to a cross sectional view of a structure of an electronic substrate.

A difference of a structure in accordance with the embodiment 10 from the embodiment 7 exists in a point that the second layer of heat radiating via hole of the wiring layer is separated into a plurality of pieces and an internal portion is charged with a copper plating 1002, and a point that heat radiating electrodes in two portions are connected to the semiconductor part by a common solder.

In accordance with the structure of the embodiment 10, since the thermal conductivity in the heat radiating via hole portion is improved, it is possible to further efficiently diffuse the heat at a time of driving the semiconductor part.

Further, the structure can be manufactured in accordance with the manufacturing method of the embodiment 7 by changing a pattern of the via hole.

As described in the embodiment 1, when processing a plurality of insulating layers and wiring layers in a lump in forming the heat radiating via hole, it is possible to omit the counter sinking process 108 in the step (c), so that it is possible to reduce a number of the steps so as to reduce a cost. The structure of the end surface of the heat radiating via hole at this time is shown in FIG. 45B, and the structure of the end surface of the heat radiating via hole in accordance with the step described in FIG. 1 is shown in FIG. 45A.

Embodiment 11

Figure 11:
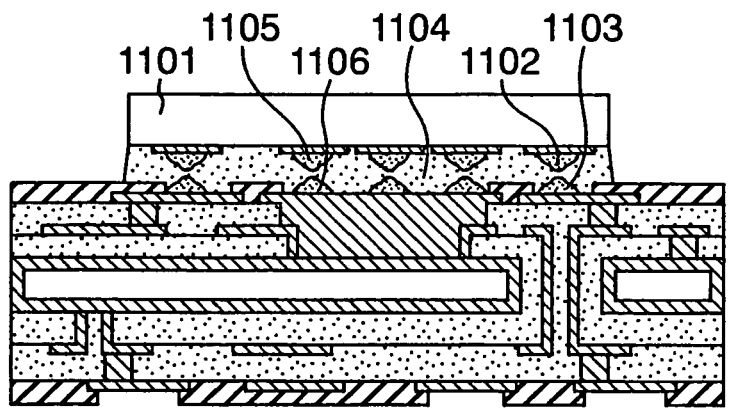
FIG. 11 is a view of a cross sectional structure of the electronic substrate used in the electronic apparatus in accordance with the present invention.

A description will be given of an embodiment 11 with reference to FIG. 11 corresponding to a cross sectional view of a structure of an electronic substrate.

A structure in accordance with the embodiment 11 is the same as the embodiment 7 except a point that an external terminal of the semiconductor part is formed as a bump type terminal 1102, a point that an electrode of a substrate connected to the bump type terminal 1102 is formed as a bump type electrode 1103, a point that a heat radiating electrode is formed as a heat radiating bump electrode 1105, a bump type terminal 1106 is formed on a copper plating charged into the heat radiating via hole, a point that the bump type terminal 1102 and the bump type electrode 1103 are electrically connected by an anisotropic conductive resin, and a point that the heat radiating bump type electrode 1105 and the bump type terminal 1103 are electrically connected by an anisotropic conductive resin.

More particularly, a height is aligned with an approximate height of the topmost layer of the wiring layer by applying the copper plating to the heat radiating via hole after forming the laminated wiring layer, by executing the steps (a) to (f) in accordance with the embodiment 5. A solder resist is formed in the other areas than the electrode and the via hole. Next, the bump type electrode 1103 is formed in the wiring terminal on the substrate, and the bump type terminal 1106 is formed on the copper plating charged into the heat radiating via hole. The bump type terminals 1102 and 1105 are formed as the external terminals of the semiconductor part. The anisotropic conductive resin is inserted between these formed bump type terminals (electrodes) 1102 and 1103, and between the terminals (electrodes) 1105 and 1106, and they are connected in accordance with a thermo compression bonding.

In accordance with the structure of the present embodiment, since it is possible to mount at a lower temperature than that of the connecting step using the solder, it is possible to reduce a heat history at a time of manufacturing the substrate. Further, it is also possible to reduce a material cost.

As described in the embodiment 1, when processing a plurality of insulating layers and wiring layers in a lump in forming the heat radiating via hole, it is possible to omit the counter sinking process 108 in the step (c), so that it is possible to reduce a number of the steps so as to reduce a cost. The structure of the end surface of the heat radiating via hole at this time is shown in FIG. 45B, and the structure of the end surface of the heat radiating via hole in accordance with the step described in FIG. 1 is shown in FIG. 45A.

Embodiment 12

Figure 12:
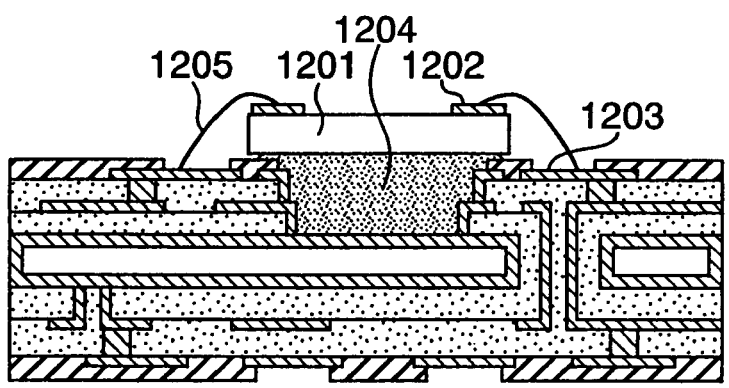
FIG. 12 is a view of a cross sectional structure of the electronic substrate used in the electronic apparatus in accordance with the present invention.

An embodiment 12 is the same as the embodiment 3 except a point that a metal core substrate and a surface on which an external terminal does not exist in the semiconductor part are mounted so as to be opposed, and the electrode on the metal core substrate surface and the external terminal of the semiconductor part are connected by a wire bonding, and a point that a connection is executed only by the charged solder without being provided with the heat radiating electrode, as shown in FIG. 12.

In accordance with the structure of the present embodiment, it is possible to increase a thermal diffusion to the complex metal plate in correspondence to the connection by the wire bonding which is generally used, and due to an increase of a contact area between the semiconductor part and the complex metal plate.

As described in the embodiment 1, when processing a plurality of insulating layers and wiring layers in a lump in forming the heat radiating via hole, it is possible to omit the counter sinking process 108 in the step (c), so that it is possible to reduce a number of the steps so as to reduce a cost. The structure of the end surface of the heat radiating via hole at this time is shown in FIG. 45B, and the structure of the end surface of the heat radiating via hole in accordance with the step described in FIG. 1 is shown in FIG. 45A.

Embodiment 13

Figure 13:
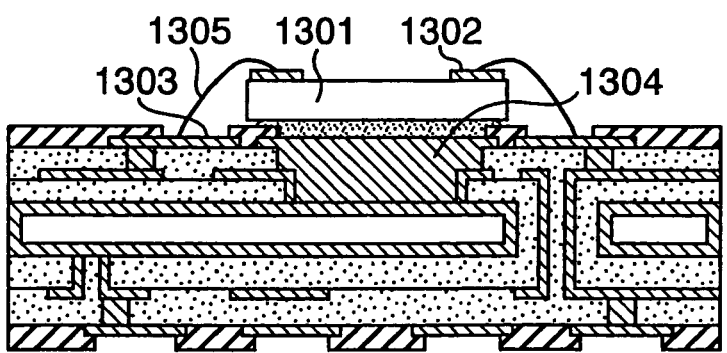
FIG. 13 is a view of a cross sectional structure of the electronic substrate used in the electronic apparatus in accordance with the present invention.

An embodiment 13 is the same as the embodiment 7 except a point that the metal core substrate and the surface (back surface) having no external terminal in the semiconductor part are mounted so as to be opposed, and the electrode on the metal core substrate surface and the terminal of the semiconductor part are connected by the wire bonding, and a point of connecting between the charged plating and the back surface of the semiconductor part by the solder without being provided with the heat radiating electrode, as shown in FIG. 13.

In accordance with the structure of the present embodiment, it is possible to increase a thermal diffusion to the complex metal plate due to an increase of a contact area between the semiconductor part and the complex metal plate.

As described in the embodiment 1, when processing a plurality of insulating layers and wiring layers in a lump in forming the heat radiating via hole, it is possible to omit the counter sinking process 108 in the step (c), so that it is possible to reduce a number of the steps so as to reduce a cost. The structure of the end surface of the heat radiating via hole at this time is shown in FIG. 45B, and the structure of the end surface of the heat radiating via hole in accordance with the step described in FIG. 1 is shown in FIG. 45A.

Embodiment 14

Figure 14:
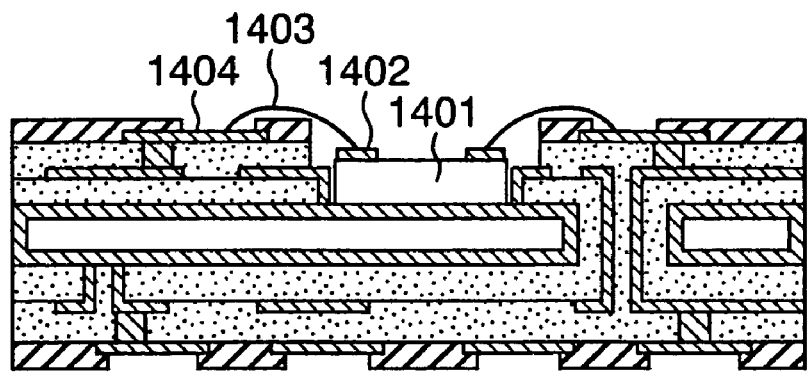
FIG. 14 is a view of a cross sectional structure of the electronic substrate used in the electronic apparatus in accordance with the present invention.
Figure 15:
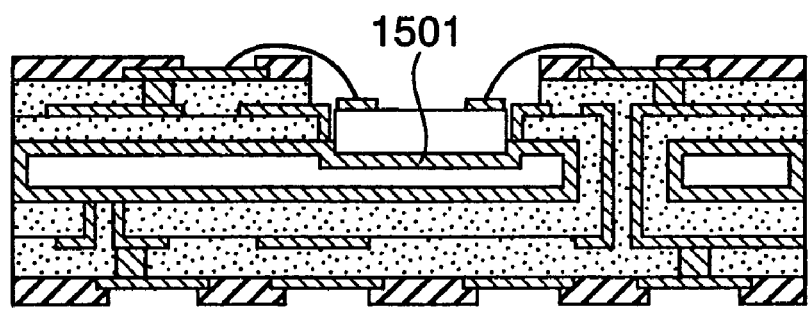
FIG. 15 is a view of a cross sectional structure of the electronic substrate used in the electronic apparatus in accordance with the present invention.

A structure in accordance with the embodiment 14 is the same as the embodiment 1 except a point that the complex metal plate is exposed by forming a via hole which is larger than a main surface of a semiconductor part 1401, and the semiconductor part is inserted to a bottom surface of the via hole and is connected by the solder, and a point that an external terminal 1402 of the semiconductor part and an electrode (wiring) 1404 of the metal core substrate side wiring are connected by a wire bonding 1403, as shown in FIG. 14. The semiconductor part 1401 and the composite metal plate can be connected by a silver paste or an adhesive agent in addition to the solder, and since it is unnecessary to form the metal layer for bonding the solder in the semiconductor part in this case, it is possible to reduce a cost.

In accordance with the structure of the present embodiment, it is possible to improve a thermal diffusion efficiency and it is possible to reduce a manufacturing cost.

As described in the embodiment 1, when processing a plurality of insulating layers and wiring layers in a lump in forming the heat radiating via hole, it is possible to omit the counter sinking process 108 in the step (c), so that it is possible to reduce a number of the steps so as to reduce a cost. The structure of the end surface of the heat radiating via hole at this time is shown in FIG. 45B, and the structure of the end surface of the heat radiating via hole in accordance with the step described in FIG. 1 is shown in FIG. 45A.

Embodiment 15

An embodiment 15 is the same as the embodiment 14 except a point that a depression 1501 is formed in the complex metal portion of the metal core substrate mounting the semiconductor part 901 thereon, and the semiconductor part 901 is mounted in the depression.

In accordance with the structure of the present embodiment, it is possible to increase an accuracy of mounting position of the semiconductor, and it is possible to obtain an effect of improving a heat radiation achieved by reducing a thickness of the complex metal plate on the semiconductor part.

The structure in accordance with the present embodiment can be manufactured by adding a step of forming the depression in the complex metal plate prior to the step (a) in the embodiment 12 (embodiment 1).

As described in the embodiment 1, when processing a plurality of insulating layers and wiring layers in a lump in forming the heat radiating via hole, it is possible to omit the counter sinking process 108 in the step (c), so that it is possible to reduce a number of the steps so as to reduce a cost. The structure of the end surface of the heat radiating via hole at this time is shown in FIG. 45B, and the structure of the end surface of the heat radiating via hole in accordance with the step described in FIG. 1 is shown in FIG. 45A.

Embodiment 16

Figure 16:
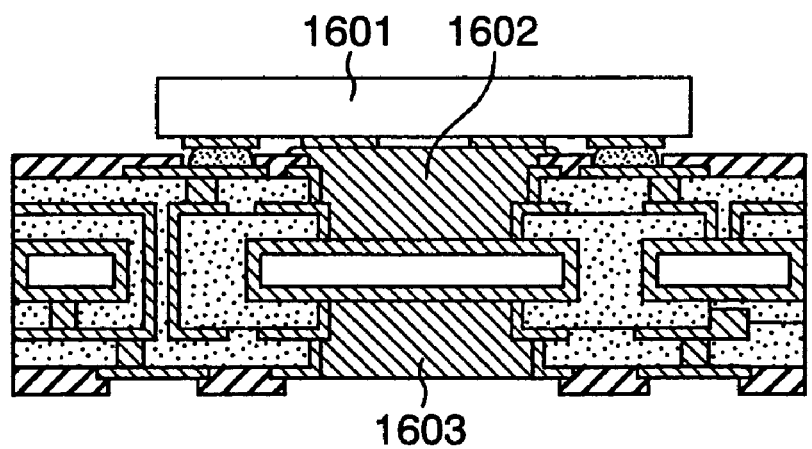
FIG. 16 is a view of a cross sectional structure of the electronic substrate used in the electronic apparatus in accordance with the present invention.

A structure of an embodiment 16 is the same as the embodiment 7 except a point that the steps to (f) shown in FIG. 16 are executed on the basis of a different pattern, a semiconductor part 1601 is mounted on the metal core substrate via a copper plating 1602 charged into the heat radiating via hole, and a heat radiating electrode 1603 connected to the metal plate via the heat radiating via hole is provided on a back surface of the semiconductor mounting surface.

In accordance with the structure of the present embodiment, since it is possible to diffuse the heat via the heat radiating electrode, it is possible to add a more excellent cooling capacity.

The structure in accordance with the present embodiment can be manufactured on the basis of the same steps as those of the embodiment 3 except a point that the via holes are provided on both surfaces. That is, it is possible to manufacture by applying the steps (a) to (g) in the embodiment 3 except the step of connecting the semiconductor part to both surfaces.

As described in the embodiment 1, when processing a plurality of insulating layers and wiring layers in a lump in forming the heat radiating via hole, it is possible to omit the counter sinking process 108 in the step (c), so that it is possible to reduce a number of the steps so as to reduce a cost. The structure of the end surface of the heat radiating via hole at this time is shown in FIG. 45B, and the structure of the end surface of the heat radiating via hole in accordance with the step described in FIG. 1 is shown in FIG. 45A.

Embodiment 17

Figure 17:
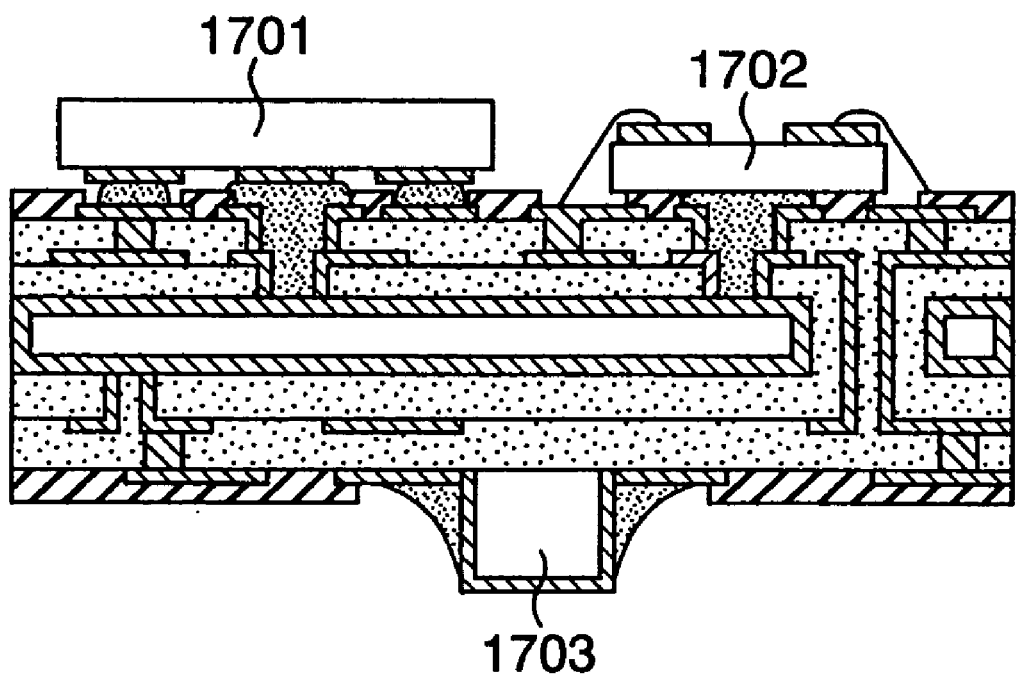
FIG. 17 is a view of a cross sectional structure of the electronic substrate used in the electronic apparatus in accordance with the present invention.

An embodiment 17 is the same as the embodiment 3 except a point that a plurality of semiconductor parts 1701 and 1702 are mounted on a main surface of the metal core substrate, and an electronic part 1703 is mounted on back surfaces of the semiconductor parts 1701 and 1702, as shown in FIG. 17.

In accordance with the structure of the present embodiment, since it is possible to diffuse the heat via the heat radiating electrode, it is possible to achieve an MCM structure to which a more excellent cooling capacity is added.

As described in the embodiment 1, when processing a plurality of insulating layers and wiring layers in a lump in forming the heat radiating via hole, it is possible to omit the counter sinking process 108 in the step (c), so that it is possible to reduce a number of the steps so as to reduce a cost. The structure of the end surface of the heat radiating via hole at this time is shown in FIG. 45B, and the structure of the end surface of the heat radiating via hole in accordance with the step described in FIG. 1 is shown in FIG. 45A.

Embodiment 18

A description will be given of an embodiment 18 with reference to FIG. 18.

Figure 18:
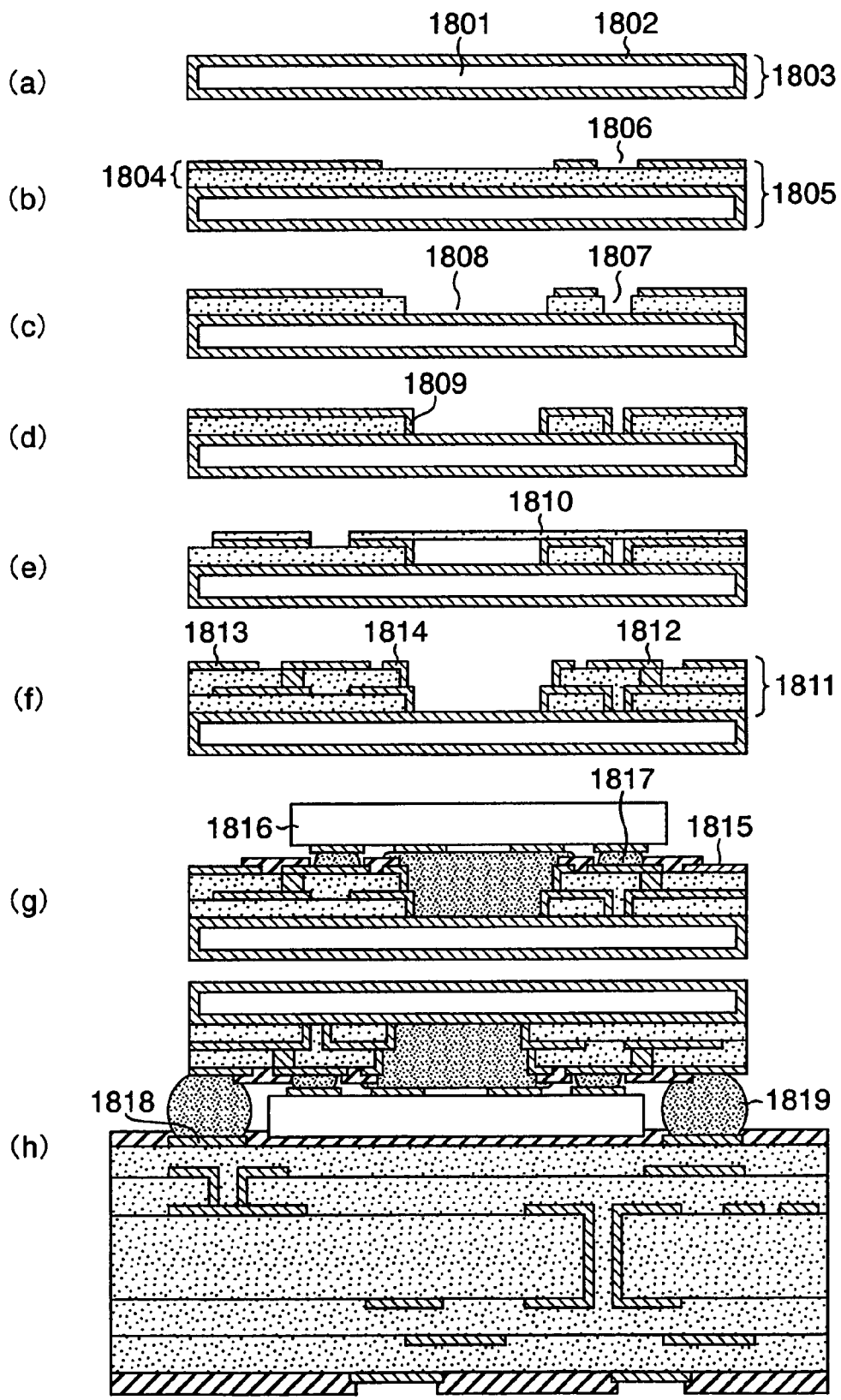
FIG. 18 is a view showing a manufacturing flow of the electronic substrate used in the electronic apparatus in accordance with the present invention.

In FIG. 18, references 1801 to 1812 denote the same structures as the elements 101 to 112 in the embodiment 1, and the steps (a) to (f) are the same except a point that an electrode 1812 is formed and an electrode 1813 is formed.

Step (g): after forming the electrode, a solder resist 1815 is laminated to a desired portion except at least the electrode and the heat radiating via hole, and a terminal of a semiconductor part 1816 and the electrode 1812, and a surface of the semiconductor part 1816 and a heat radiating via hole 1814 are connected via a solder 1817.

Step (h): finally, an electrode 1818 provided in an outermost layer of a printed circuit board on which a copper wiring is laminated via a pre-preg and the electrode 1813 of the metal core substrate are connected via a solder 1819.

In accordance with the structure of the present embodiment, it is possible to efficiently diffuse a heat at a time of driving the semiconductor part. Further, since an improved electric connection is established in the via hole and the heat radiating via hole portion, and the metal plate having a high rigidity is set to a core, a handling on manufacturing is excellent.

As described in the embodiment 1, when processing a plurality of insulating layers and wiring layers in a lump in forming the heat radiating via hole, it is possible to omit the counter sinking process 108 in the step (c), so that it is possible to reduce a number of the steps so as to reduce a cost. The structure of the end surface of the heat radiating via hole at this time is shown in FIG. 45B, and the structure of the end surface of the heat radiating via hole in accordance with the step described in FIG. 1 is shown in FIG. 45A.

Embodiment 19

Figure 19:
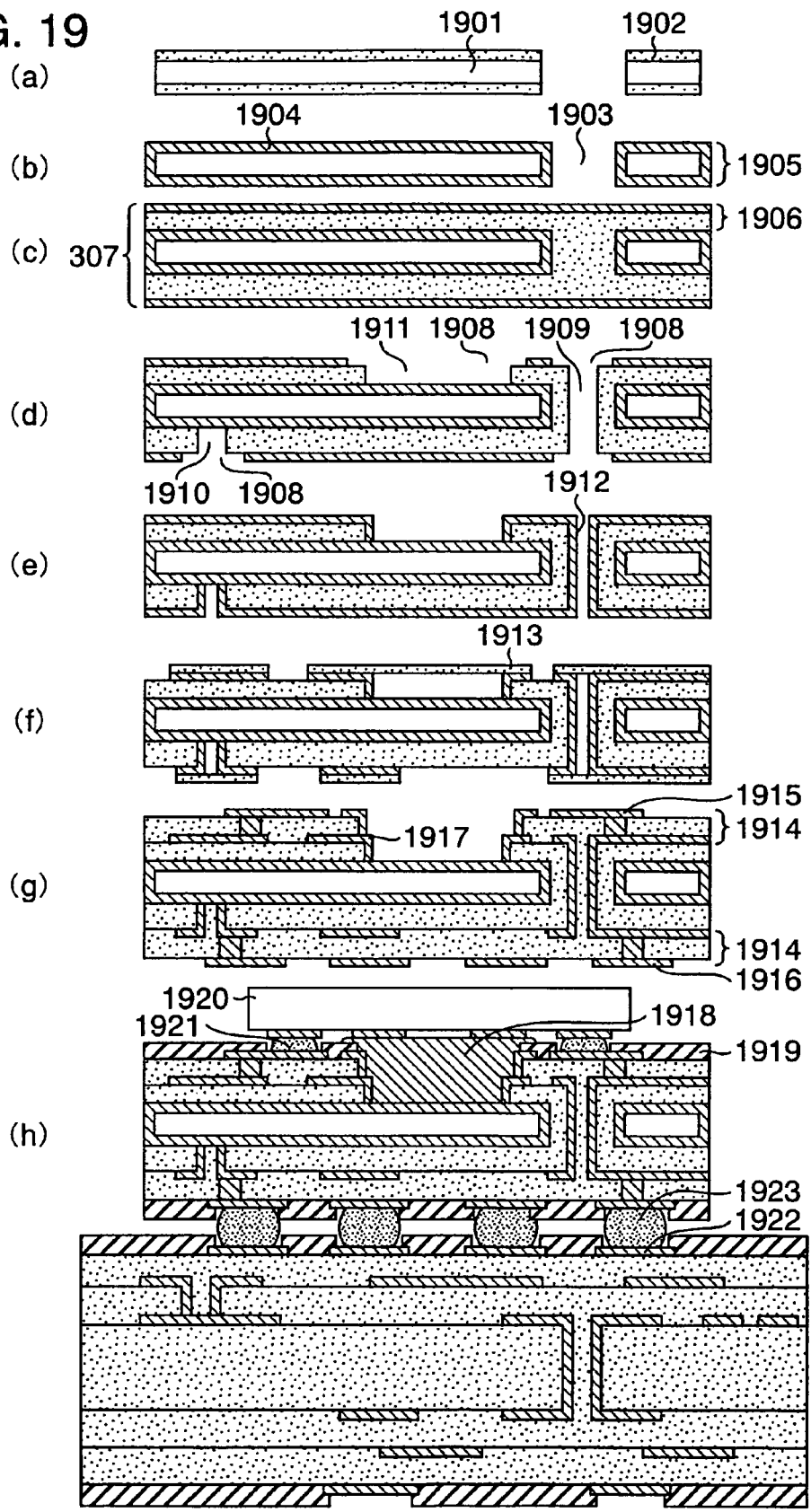
FIG. 19 is a view showing a manufacturing flow of the electronic substrate used in the electronic apparatus in accordance with the present invention.

A description will be given of an embodiment 19 with reference to FIG. 19. In FIG. 19, references 1901 to 1912 denote the same structures as the elements 301 to 312 in the embodiment 3, and the steps (a) to (f) are the same structure as those in FIG. 3 except a point that an electrode 1915 is formed and an electrode 1916 is formed.

A heat radiating electrode 1918 connected to a composite metal plate 1905 is formed by forming the electrodes 1915 and 1916, thereafter further precipitating an electric plating from the composite metal plate and charging the heat radiating via hole by the copper. A solder resist 1919 is formed in a desired portion except at least the electrode and the heat radiating electrode. A terminal of a semiconductor part 1920 and the electrode 1915 of the metal core substrate, a surface of the semiconductor part 1920 and the heat radiating electrode 1918 of the metal core substrate are mounted and connected via a solder 1921. Finally, an electrode 1922 provided in an outermost layer of the printed circuit board on which the copper wiring is laminated via the pre-preg, and the electrode 1916 of the metal core substrate are connected via a solder 1923.

In accordance with the structure of the present embodiment, it is possible to efficiently diffuse the heat at a time of driving the semiconductor part. Since 42 alloy having a high rigidity is set to a core, not only it is possible to improve a through hole density in the core layer due to a thinness of the core substrate, but also a handling on manufacturing is excellent.

As described in the embodiment 1, when processing a plurality of insulating layers and wiring layers in a lump in forming the heat radiating via hole, it is possible to omit the counter sinking process 108 in the step (c), so that it is possible to reduce a number of the steps so as to reduce a cost. The structure of the end surface of the heat radiating via hole at this time is shown in FIG. 45B, and the structure of the end surface of the heat radiating via hole in accordance with the step described in FIG. 1 is shown in FIG. 45A.

Embodiment 20

Figure 20:
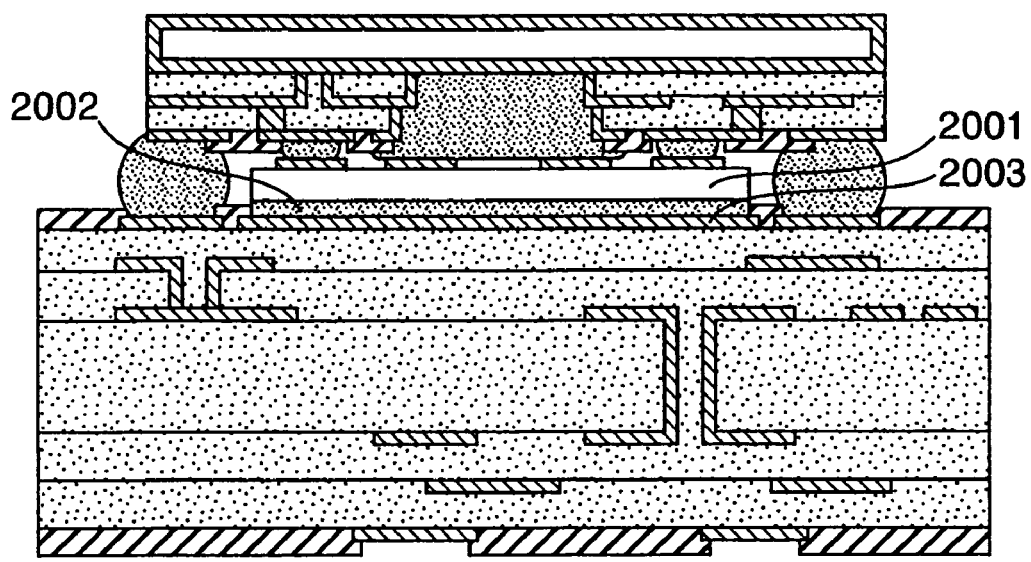
FIG. 20 is a view of a cross sectional structure of the electronic substrate used in the electronic apparatus in accordance with the present invention.

An embodiment 20 is manufactured in the same manner as that of the embodiment 18 except a point that a heat radiating electrode 2002 is provided in a mounting portion of a printed circuit board on which a metal core substrate mounting a semiconductor part 2001 thereon is mounted, and the semiconductor part 2001 and the heat radiating electrode 2002 are connected via a solder 2003, as shown in FIG. 20.

In accordance with the structure of the present embodiment, it is possible to further efficiently diffuse the heat at a time of driving the semiconductor part.

As described in the embodiment 1, when processing a plurality of insulating layers and wiring layers in a lump in forming the heat radiating via hole, it is possible to omit the counter sinking process 108 in the step (c), so that it is possible to reduce a number of the steps so as to reduce a cost. The structure of the end surface of the heat radiating via hole at this time is shown in FIG. 45B, and the structure of the end surface of the heat radiating via hole in accordance with the step described in FIG. 1 is shown in FIG. 45A.

Embodiment 21

Figure 21:
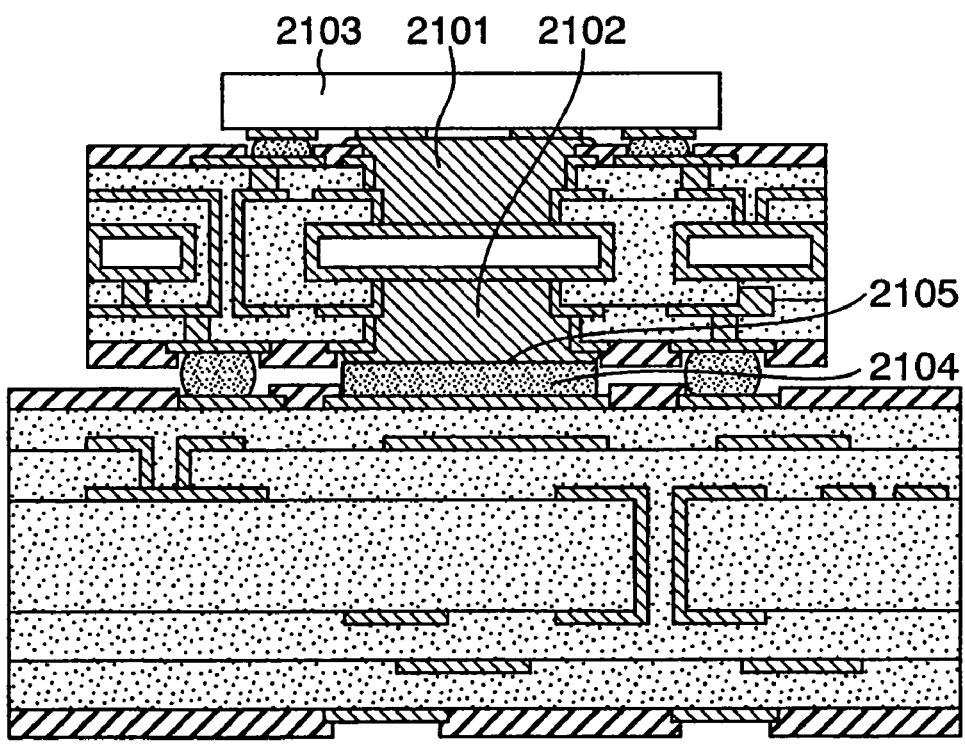
FIG. 21 is a view of a cross sectional structure of the electronic substrate used in the electronic apparatus in accordance with the present invention.

In an embodiment 21, a mounting structure is manufactured in the same manner as that of the embodiment 19 except a point that a semiconductor part 2103 is mounted in a heat radiating electrode 2101 on one of front and back surfaces of a metal core substrate in which heat radiating electrodes 2101 and 2102 are formed on both surfaces of a complex metal plate, and another heat radiating electrode 2102 and a heat radiating electrode 2104 of the printed circuit board are connected via a solder 2105, as shown in FIG. 21.

In accordance with the structure of the present embodiment, it is possible to improve a thermal diffusion efficiency at a time of mounting the semiconductor on the printed circuit board.

As described in the embodiment 1, when processing a plurality of insulating layers and wiring layers in a lump in forming the heat radiating via hole, it is possible to omit the counter sinking process 108 in the step (c), so that it is possible to reduce a number of the steps so as to reduce a cost. The structure of the end surface of the heat radiating via hole at this time is shown in FIG. 45B, and the structure of the end surface of the heat radiating via hole in accordance with the step described in FIG. 1 is shown in FIG. 45A.

Embodiment 22

Figure 22:
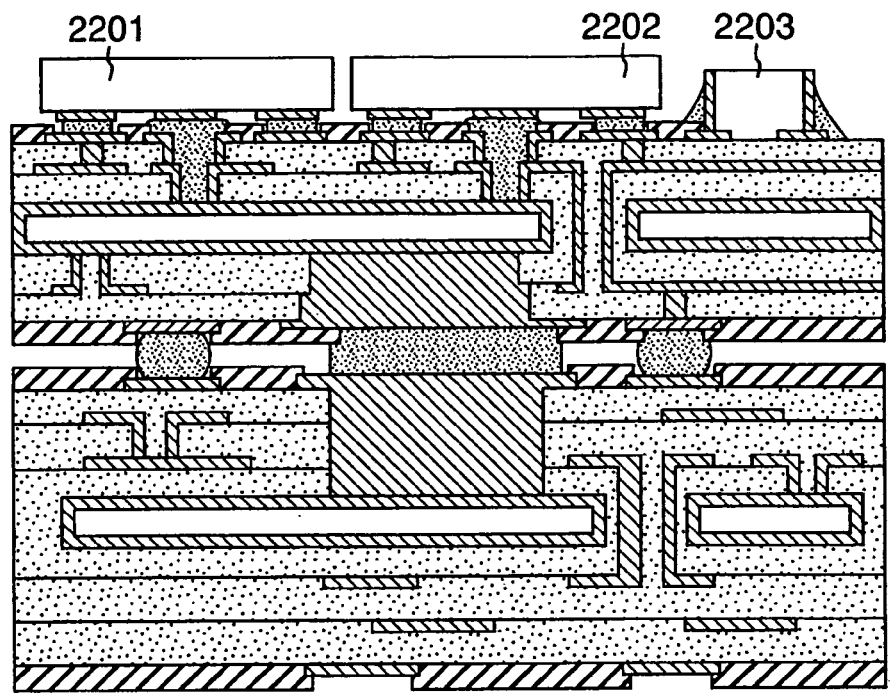
FIG. 22 is a view of a cross sectional structure of the electronic substrate used in the electronic apparatus in accordance with the present invention.

An embodiment 22 is manufactured in the same manner as that of the embodiment 19 except a point that a plurality of semiconductor parts 2201 and 2202 and a memory 2203 are mounted on the metal core substrate, as shown in FIG. 22.

In accordance with the structure of the present embodiment, it is possible to improve a mounting density to the printed circuit board.

As described in the embodiment 1, when processing a plurality of insulating layers and wiring layers in a lump in forming the heat radiating via hole, it is possible to omit the counter sinking process 108 in the step (c), so that it is possible to reduce a number of the steps so as to reduce a cost. The structure of the end surface of the heat radiating via hole at this time is shown in FIG. 45B, and the structure of the end surface of the heat radiating via hole in accordance with the step described in FIG. 1 is shown in FIG. 45A.

Embodiment 23

Figure 23:
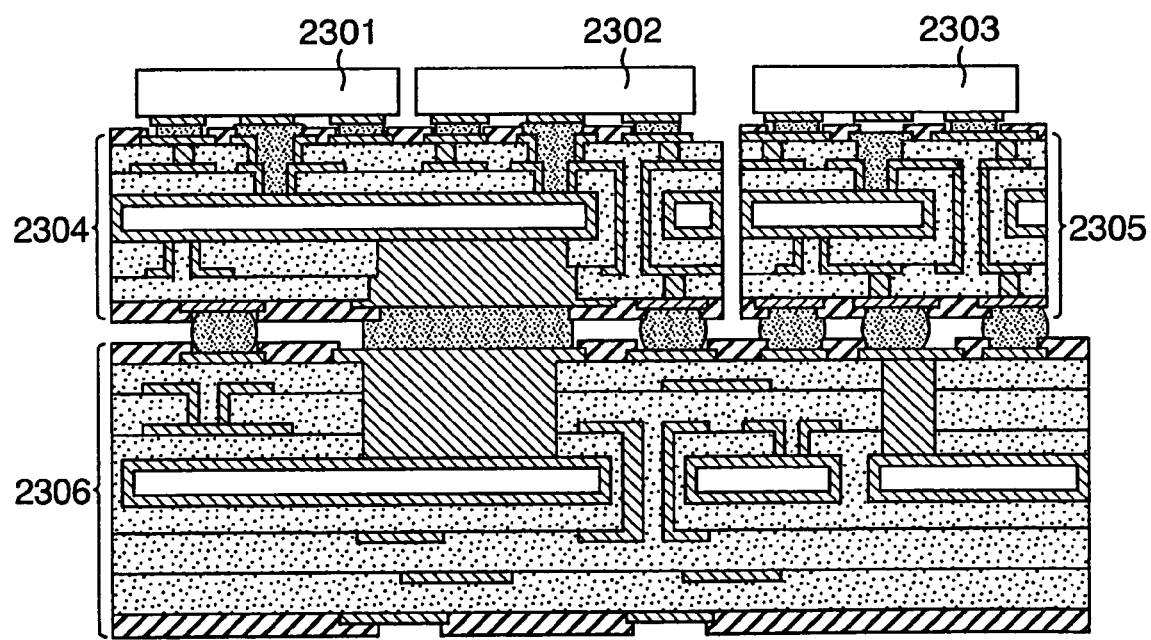
FIG. 23 is a view of a cross sectional structure of the electronic substrate used in the electronic apparatus in accordance with the present invention.

An embodiment 23 is manufactured in the same manner as that of the embodiment 19 except a point that a plurality of metal cores 2304 and 2305 mounting semiconductor parts 2301, 2302 and 2303 thereon are mounted on a printed circuit board 2306, as shown in FIG. 23.

In accordance with the structure of the present embodiment, it is possible to improve a mounting density to the printed circuit board.

As described in the embodiment 1, when processing a plurality of insulating layers and wiring layers in a lump in forming the heat radiating via hole, it is possible to omit the counter sinking process 108 in the step (c), so that it is possible to reduce a number of the steps so as to reduce a cost. The structure of the end surface of the heat radiating via hole at this time is shown in FIG. 45B, and the structure of the end surface of the heat radiating via hole in accordance with the step described in FIG. 1 is shown in FIG. 45A.

Embodiment 24

Figure 24:
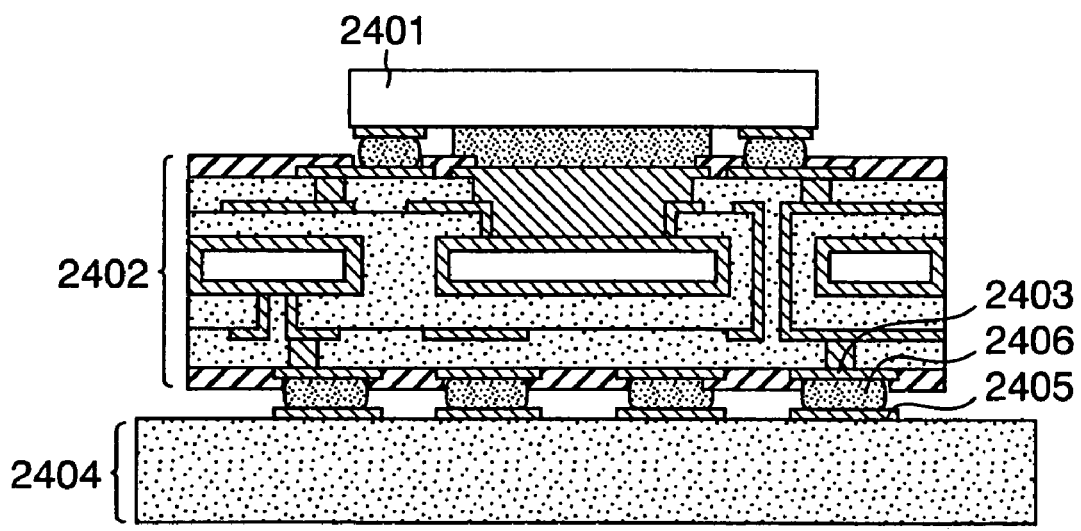
FIG. 24 is a view of a cross sectional structure of the electronic substrate used in the electronic apparatus in accordance with the present invention.

In an embodiment 24, an electronic apparatus is manufactured in the same manner as that of the embodiment 19 except a point that an electrode 2403 of a metal core substrate 2402 mounting a semiconductor part 2401 thereon and an electrode 2405 formed in a ceramic substrate 2404 are connected and mounted via a solder 2406, as shown in FIG. 24.

In accordance with the structure of the present embodiment, it is possible to improve a heat resistance.

As described in the embodiment 1, when processing a plurality of insulating layers and wiring layers in a lump in forming the heat radiating via hole, it is possible to omit the counter sinking process 108 in the step (c), so that it is possible to reduce a number of the steps so as to reduce a cost. The structure of the end surface of the heat radiating via hole at this time is shown in FIG. 45B, and the structure of the end surface of the heat radiating via hole in accordance with the step described in FIG. 1 is shown in FIG. 45A.

Embodiment 25

Figure 25:
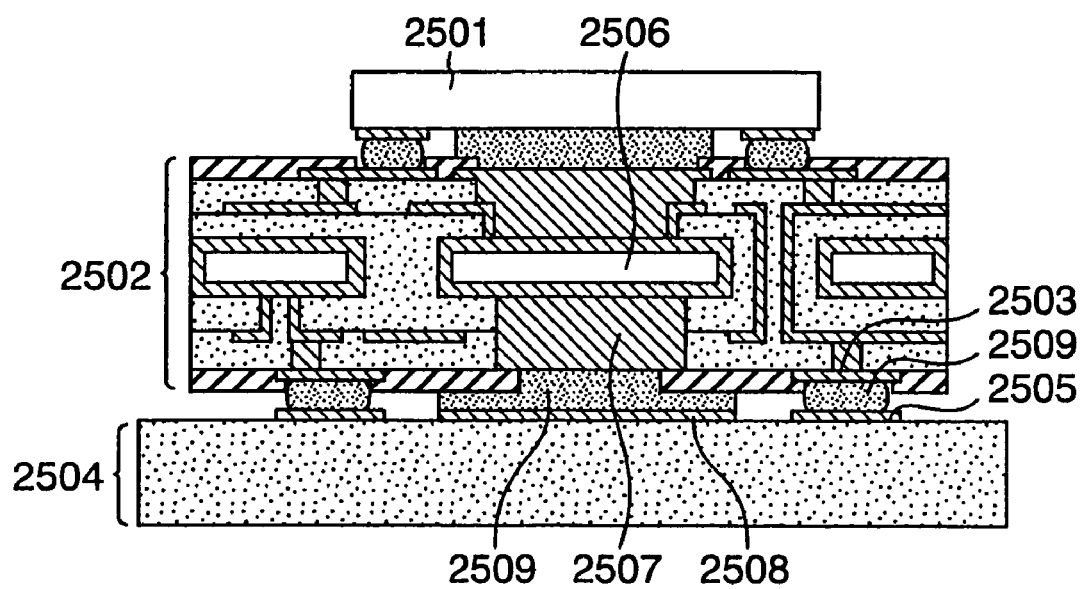
FIG. 25 is a view of a cross sectional structure of the electronic substrate used in the electronic apparatus in accordance with the present invention.

In an embodiment 25, an electronic apparatus is manufactured in the same manner as that of the embodiment 19 except a point that an electrode 2503 of a metal core substrate 2502 mounting a semiconductor part 2501 thereon and an electrode 2505 formed in a ceramic substrate 2504, and a heat radiating electrode 2507 connected to an internal layer metal plate 2506 of the metal core substrate and a heat radiating electrode 2508 provided in the ceramic substrate are connected and mounted via a solder 2509, as shown in FIG. 25.

In accordance with the structure of the present embodiment, it is possible to improve a heat resistance.

As described in the embodiment 1, when processing a plurality of insulating layers and wiring layers in a lump in forming the heat radiating via hole, it is possible to omit the counter sinking process 108 in the step (c), so that it is possible to reduce a number of the steps so as to reduce a cost. The structure of the end surface of the heat radiating via hole at this time is shown in FIG. 45B, and the structure of the end surface of the heat radiating via hole in accordance with the step described in FIG. 1 is shown in FIG. 45A.

Embodiment 26

Figure 26:
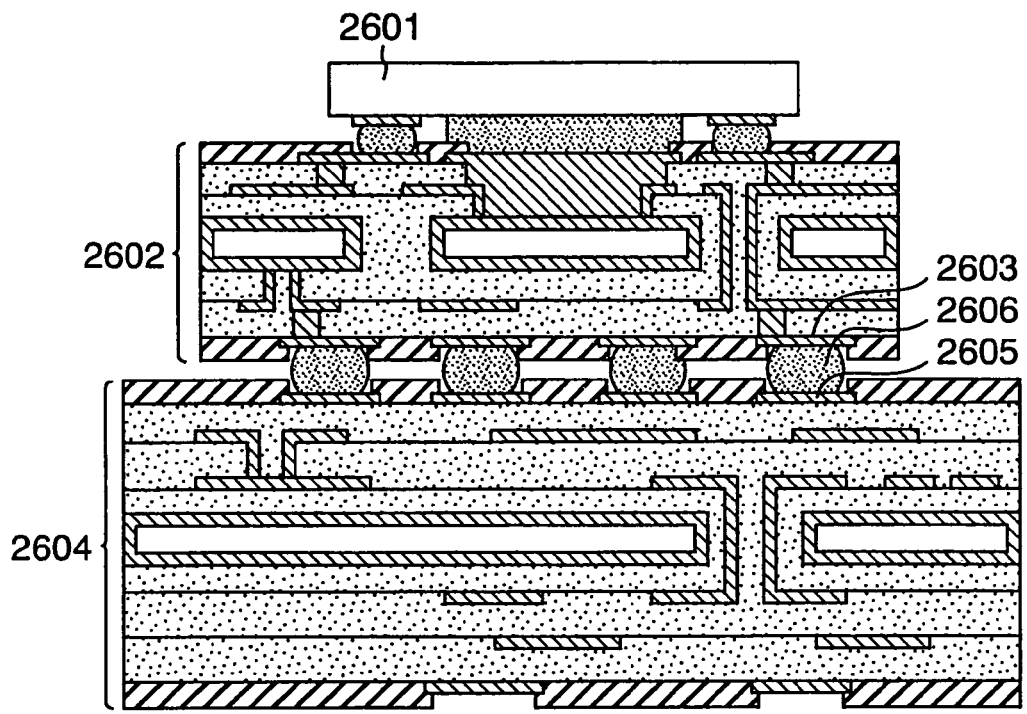
FIG. 26 is a view of a cross sectional structure of the electronic substrate used in the electronic apparatus in accordance with the present invention.

An embodiment 26 is the same as the embodiment 19 except a point that an electrode A 2603 of a metal core substrate A 2602 mounting a semiconductor part 2601 thereon and an electrode B 2605 formed in a metal core substrate B 2604 are connected and mounted via a solder 2606, as shown in FIG. 26.

In accordance with the structure of the present embodiment, it is possible to improve a heat resistance.

As described in the embodiment 1, when processing a plurality of insulating layers and wiring layers in a lump in forming the heat radiating via hole, it is possible to omit the counter sinking process 108 in the step (c), so that it is possible to reduce a number of the steps so as to reduce a cost. The structure of the end surface of the heat radiating via hole at this time is shown in FIG. 45B, and the structure of the end surface of the heat radiating via hole in accordance with the step described in FIG. 1 is shown in FIG. 45A.

Embodiment 27

Figure 27:
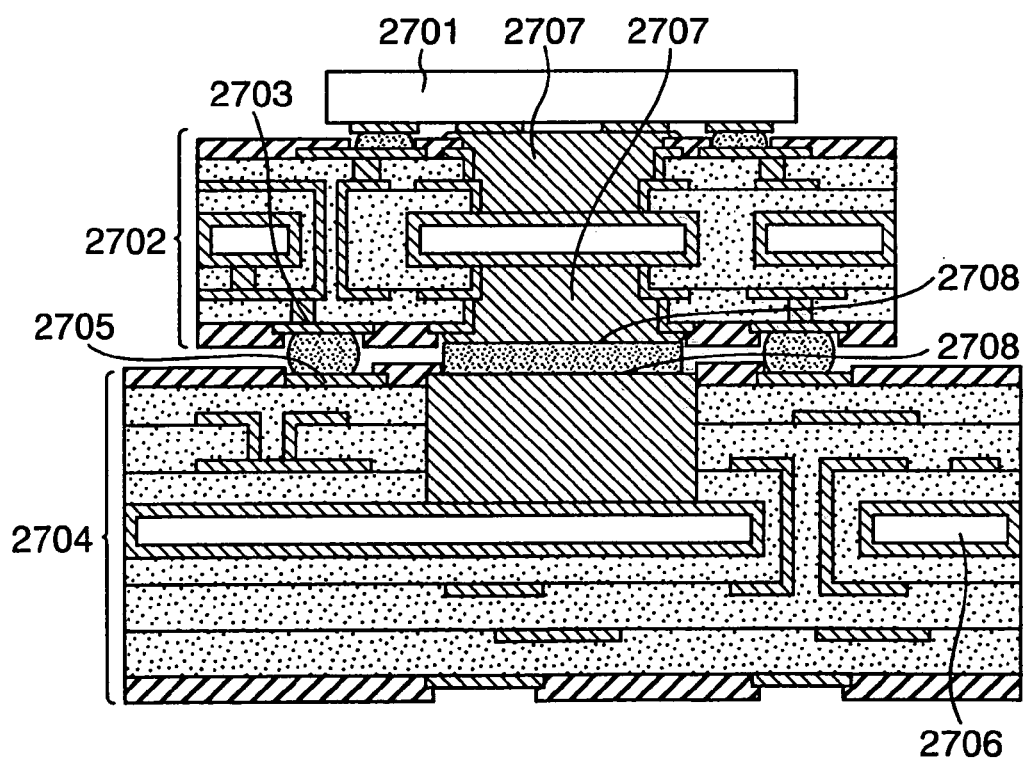
FIG. 27 is a view of a cross sectional structure of the electronic substrate used in the electronic apparatus in accordance with the present invention.

An embodiment 27 is manufactured in the same manner as that of the embodiment 19 except a point that an electrode A 2703 of a metal core substrate A 2702 mounting a semiconductor part 2701 thereon and an electrode B 2705 formed in a metal core substrate B 2704, and a heat radiating electrode 2707 connected to an internal layer metal plate 2706 of the metal core A and a heat radiating electrode B 2708 provided in the metal core substrate B are connected and mounted via a solder 2709, as shown in FIG. 27.

In accordance with the structure of the present embodiment, it is possible to improve a heat resistance and a heat radiation property with respect to the main substrate.

As described in the embodiment 1, when processing a plurality of insulating layers and wiring layers in a lump in forming the heat radiating via hole, it is possible to omit the counter sinking process 108 in the step (c), so that it is possible to reduce a number of the steps so as to reduce a cost. The structure of the end surface of the heat radiating via hole at this time is shown in FIG. 45B, and the structure of the end surface of the heat radiating via hole in accordance with the step described in FIG. 1 is shown in FIG. 45A.

Embodiment 28

Figure 28:
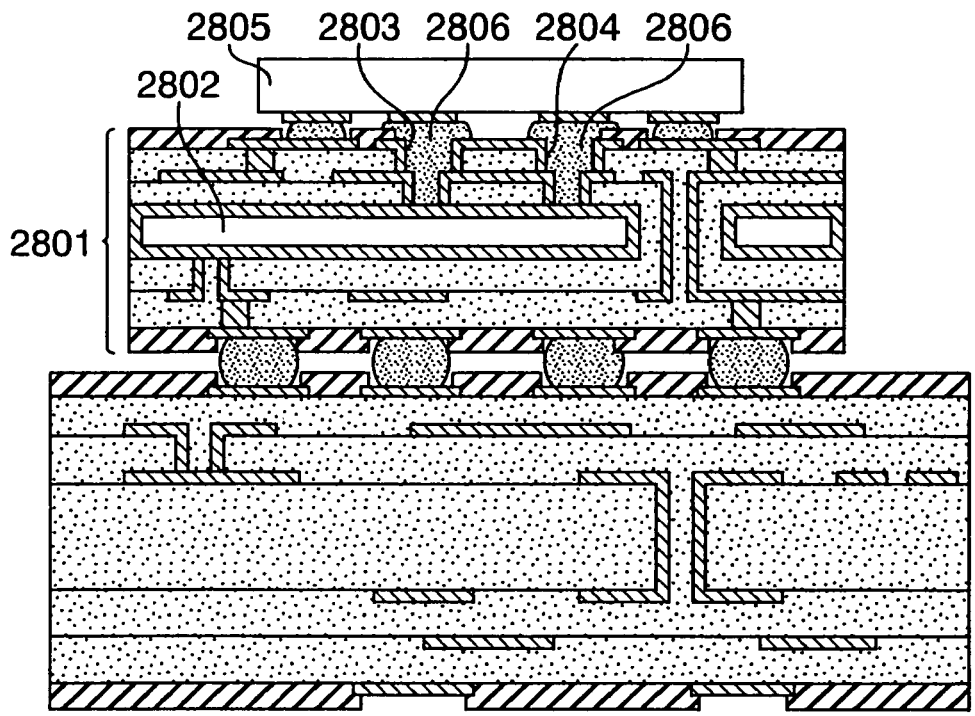
FIG. 28 is a view of a cross sectional structure of the electronic substrate used in the electronic apparatus in accordance with the present invention.

An embodiment 28 is manufactured in the same manner as that of the embodiment 19 except a point that a plurality of heat radiating via holes 2803 and 2804 connected to a complex metal plate 2802 of a metal core substrate 2801, and a semiconductor part 2805 are connected via a solder 2806, as shown in FIG. 28.

In accordance with the structure of the present embodiment, it is possible to diffuse a stress due to a heat at a time of driving the semiconductor part. Further, since the step of forming the heat radiating via hole can be simplified, it is possible to reduce the cost.

As described in the embodiment 1, when processing a plurality of insulating layers and wiring layers in a lump in forming the heat radiating via hole, it is possible to omit the counter sinking process 108 in the step (c), so that it is possible to reduce a number of the steps so as to reduce a cost. The structure of the end surface of the heat radiating via hole at this time is shown in FIG. 45B, and the structure of the end surface of the heat radiating via hole in accordance with the step described in FIG. 1 is shown in FIG. 45A.

Embodiment 29

Figure 29:
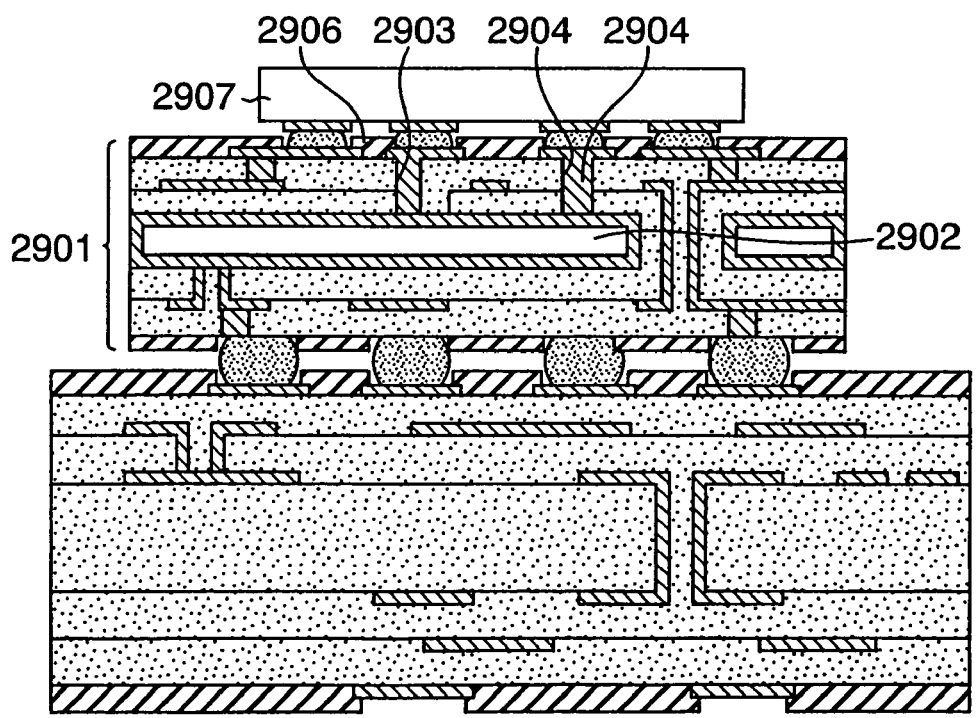
FIG. 29 is a view of a cross sectional structure of the electronic substrate used in the electronic apparatus in accordance with the present invention.

An embodiment 29 is manufactured in the same manner as that of the embodiment 19 except a point that a plurality of heat radiating via holes 2903 and 2904 connected to a complex metal plate 2902 of a metal core substrate 2901 are provided, are charged with an electric copper plating 2905, and are connected to a semiconductor part 2907 via a solder 2906, as shown in FIG. 29.

In accordance with the structure of the present embodiment, it is possible to simplify an initial bonding property and a bonding process between the semiconductor part and the metal core substrate by the solder with keeping the thermal diffusion property, and it is possible to reduce the cost.

As described in the embodiment 1, when processing a plurality of insulating layers and wiring layers in a lump in forming the heat radiating via hole, it is possible to omit the counter sinking process 108 in the step (c), so that it is possible to reduce a number of the steps so as to reduce a cost. The structure of the end surface of the heat radiating via hole at this time is shown in FIG. 45B, and the structure of the end surface of the heat radiating via hole in accordance with the step described in FIG. 1 is shown in FIG. 45A.

Embodiment 30

Figure 30:
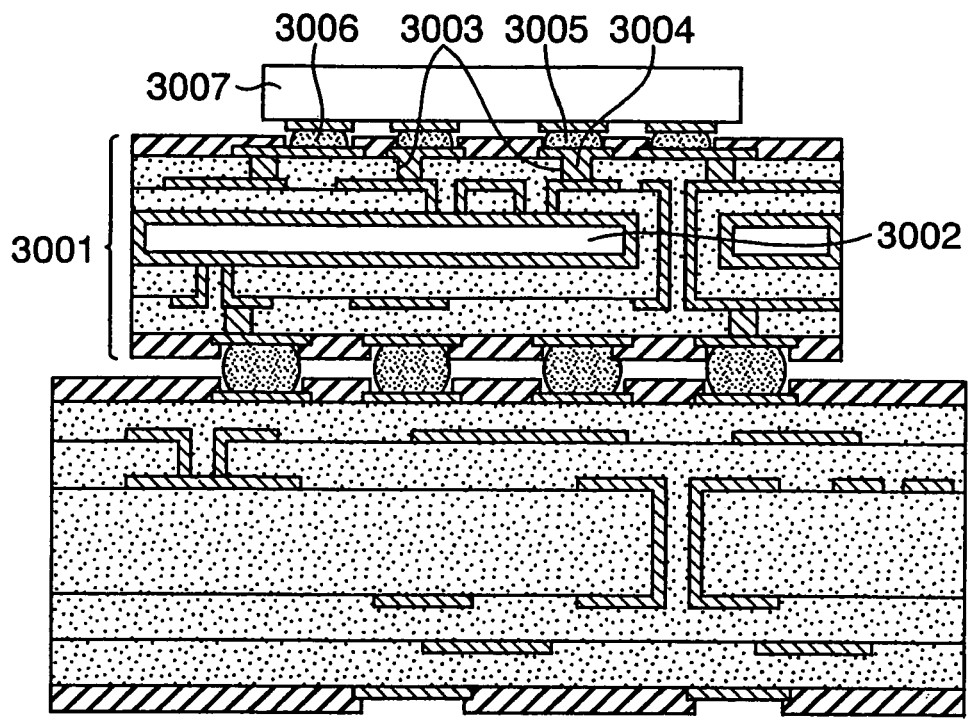
FIG. 30 is a view of a cross sectional structure of the electronic substrate used in the electronic apparatus in accordance with the present invention.

An embodiment 30 is manufactured in the same manner as that of the embodiment 19 except a point that a plurality of heat radiating via holes 3004 in a second layer of copper foil portion with resin are provided via a plurality of via holes 3003 in a first layer of copper foil portion with resin connected to a composite metal plate 3002 of a metal core substrate 3001, are charged with an electric copper plating, and are connected to a semiconductor part 3007 via a solder 3006 by setting these surfaces to a heat radiating electrode 3005, as shown in FIG. 30.

In accordance with the structure of the present embodiment, it is possible to simplify an initial bonding property and a bonding process between the semiconductor part and the metal core substrate by the solder with keeping the thermal diffusion property, and it is possible to reduce the cost.

Embodiment 31

Figure 31:
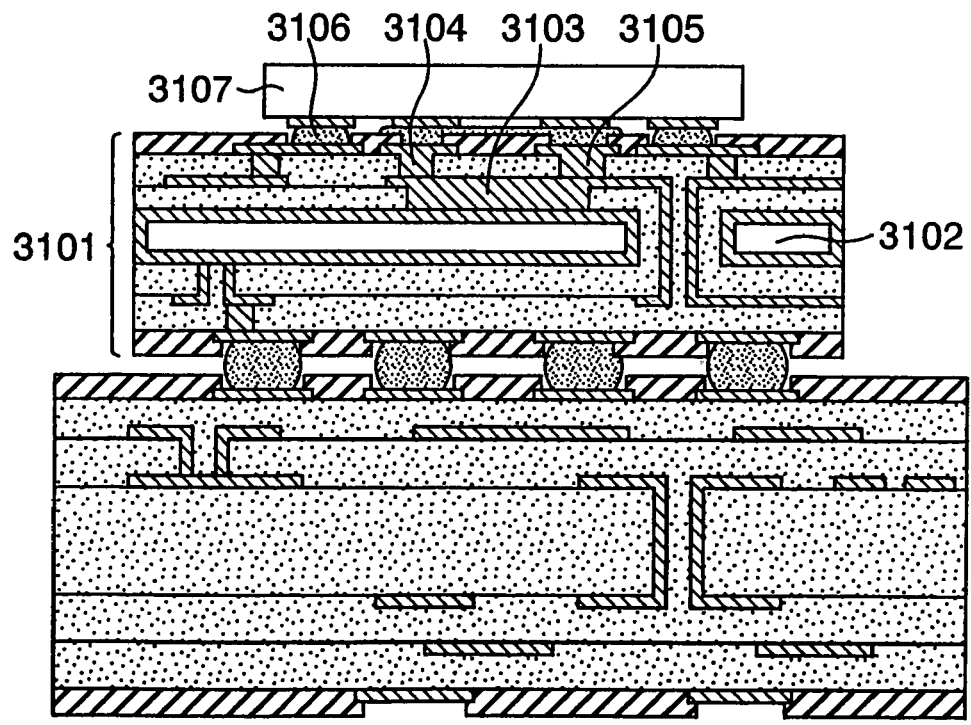
FIG. 31 is a view of a cross sectional structure of the electronic substrate used in the electronic apparatus in accordance with the present invention.

An embodiment 31 is manufactured in the same manner as that of the embodiment 19 except a point that an electric plating 3103 is charged into one heat radiating via hole in a first layer of copper foil portion with resin connected to a composite metal plate 3102 of a metal core substrate 3101, a plurality of heat radiating via holes in a second layer of copper foil portion with resin are provided, are charged with an electric copper plating in an internal portion, and are connected to a semiconductor part 3107 via a solder 3106 by setting them to a heat radiating electrode 3105, as shown in FIG. 31.

In accordance with the structure of the present embodiment, it is possible to simplify an initial bonding property and a bonding process between the semiconductor part and the metal core substrate by the solder with keeping the thermal diffusion property, and it is possible to reduce the cost.

Embodiment 32

Figure 32:
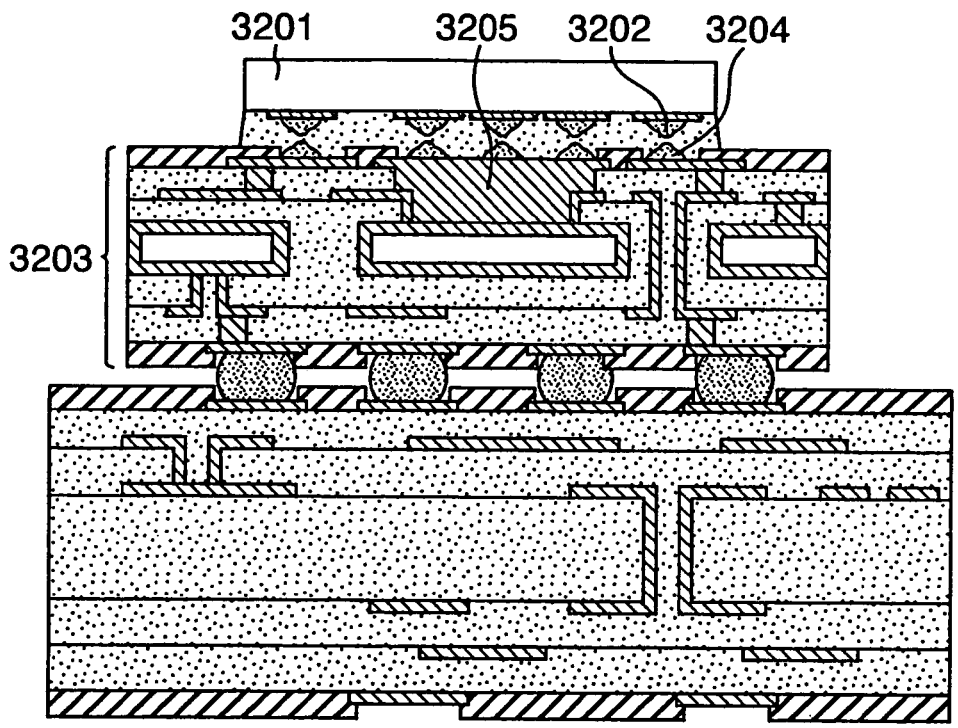
FIG. 32 is a view of a cross sectional structure of the electronic substrate used in the electronic apparatus in accordance with the present invention.

In an embodiment 32, a mounting structure is manufactured in the same manner as that of the embodiment 19 except a point that a bump type terminal 3202 of a semiconductor part 3201 and a bump type electrode 3204 of a metal core substrate 3203 are mounted via an anisotropic conductive resin 3205, as shown in FIG. 32.

In accordance with the structure of the present embodiment, since it is possible to mount at a lower temperature than the connecting step using the solder, it is possible to reduce a heat history at a time of manufacturing the substrate. Further, it is possible to reduce a material cost.

As described in the embodiment 1, when processing a plurality of insulating layers and wiring layers in a lump in forming the heat radiating via hole, it is possible to omit the counter sinking process 108 in the step (c), so that it is possible to reduce a number of the steps so as to reduce a cost. The structure of the end surface of the heat radiating via hole at this time is shown in FIG. 45B, and the structure of the end surface of the heat radiating via hole in accordance with the step described in FIG. 1 is shown in FIG. 45A.

Embodiment 33

Figure 33:
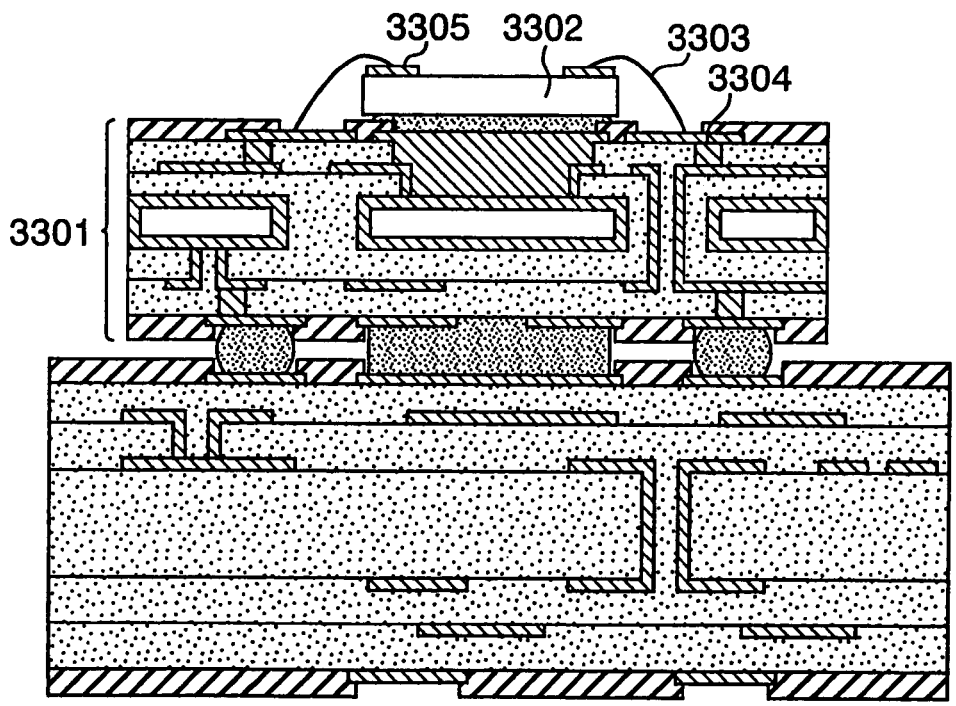
FIG. 33 is a view of a cross sectional structure of the electronic substrate used in the electronic apparatus in accordance with the present invention.

An embodiment 33 is manufactured in the same manner as that of the embodiment 19 except a point that a metal core substrate 3301 and a surface on which a terminal does not exist in a semiconductor part 3302 are mounted so as to be opposed, and an electrode 3304 on the metal core substrate surface and a terminal 3305 of the semiconductor part are connected by a wire bonding 3303, as shown in FIG. 33.

In accordance with the structure of the present embodiment, it is possible to increase a thermal diffusion to the complex metal plate due to an increase of a contact area between the semiconductor part and the complex metal plate.

As described in the embodiment 1, when processing a plurality of insulating layers and wiring layers in a lump in forming the heat radiating via hole, it is possible to omit the counter sinking process 108 in the step (c), so that it is possible to reduce a number of the steps so as to reduce a cost. The structure of the end surface of the heat radiating via hole at this time is shown in FIG. 45B, and the structure of the end surface of the heat radiating via hole in accordance with the step described in FIG. 1 is shown in FIG. 45A.

Embodiment 34

Figure 34:
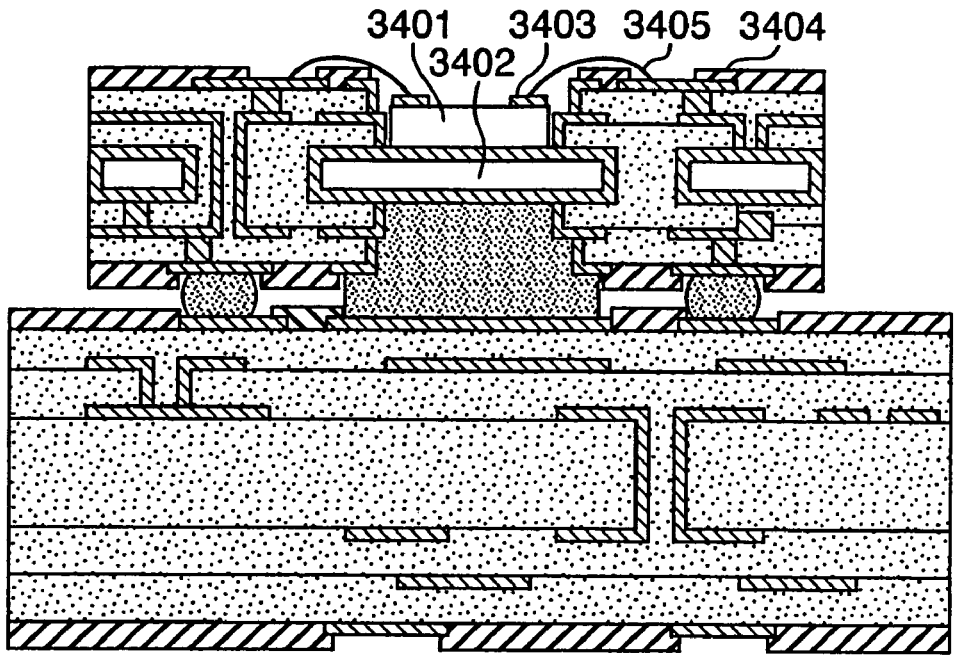
FIG. 34 is a view of a cross sectional structure of the electronic substrate used in the electronic apparatus in accordance with the present invention.

An embodiment 34 is manufactured in the same manner as that of the embodiment 19 except a point that an exposed complex metal portion 3402 of a metal core substrate which is largely exposed from a main surface of a semiconductor part 3401, and a back surface B of a surface A having an electrode A 3403 of the semiconductor part are connected by a solder, and the electrode A and an electrode B 3404 formed on a surface of a copper foil with resin in the metal core substrate are connected by a wire bonding 3405, as shown in FIG. 34.

In accordance with the structure of the present embodiment, it is possible to improve a thermal diffusion efficiency, and it is possible to make a manufacturing cost of a mounting structure inexpensive.

Figure 40:
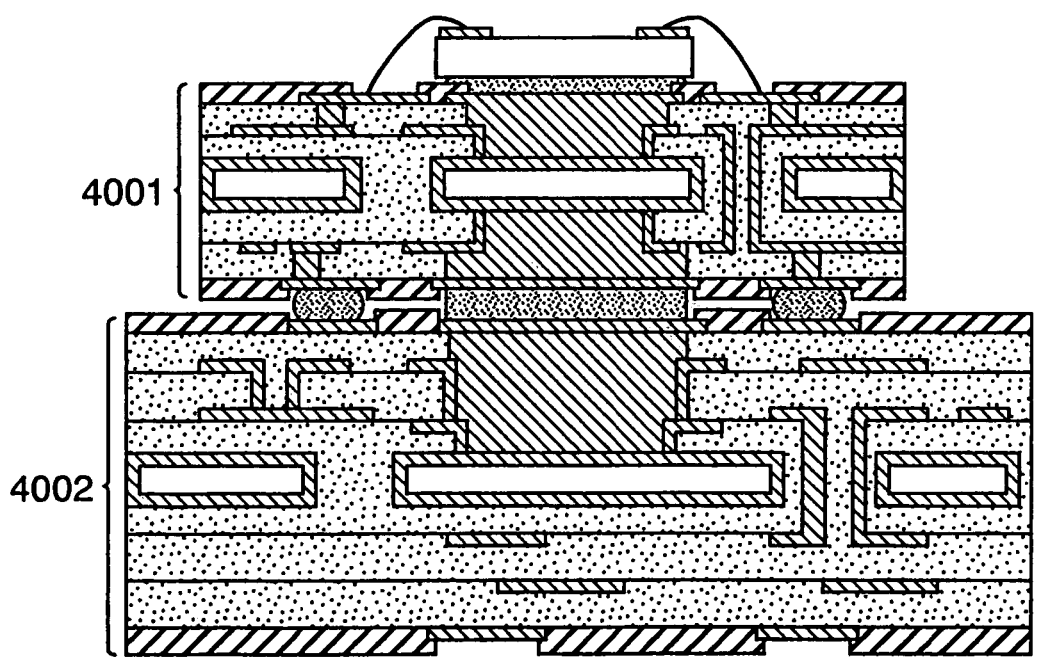
FIG. 40 is a view of a cross sectional structure of the electronic substrate used in the electronic apparatus in accordance with the present invention.
Figure 41:
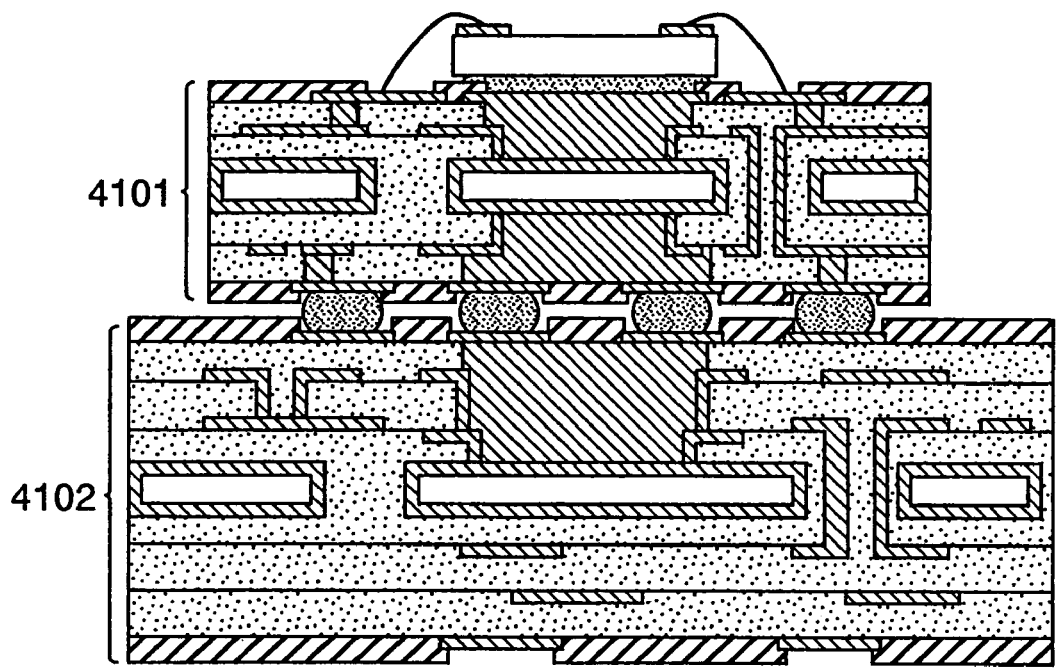
FIG. 41 is a view of a cross sectional structure of the electronic substrate used in the electronic apparatus in accordance with the present invention.

Further, as shown in FIG. 41, when the structure is made such that the heat radiating via hole is made smaller than the chip size and the inner layer wiring can be applied to the area immediately below the chip, it is possible to increase a freedom of wiring pattern design and it is possible to reduce the size of the metal core substrate while the heat radiating property is slightly reduced. In accordance with a relation between the heat radiating property and the area of the heat radiating portion which is represented by FIG. 40, it is possible to design the substrate taking the heat radiating property and the freedom of the substrate wiring into consideration.

As described in the embodiment 1, when processing a plurality of insulating layers and wiring layers in a lump in forming the heat radiating via hole, it is possible to omit the counter sinking process 108 in the step (c), so that it is possible to reduce a number of the steps so as to reduce a cost. The structure of the end surface of the heat radiating via hole at this time is shown in FIG. 45B, and the structure of the end surface of the heat radiating via hole in accordance with the step described in FIG. 1 is shown in FIG. 45A.

Embodiment 35

Figure 35:
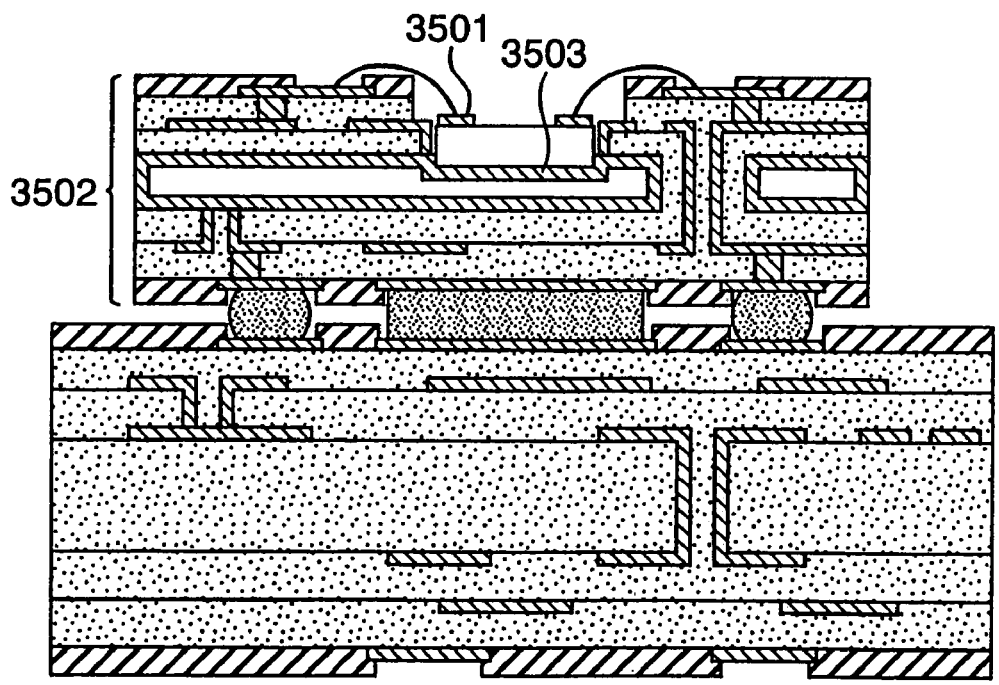
FIG. 35 is a view of a cross sectional structure of the electronic substrate used in the electronic apparatus in accordance with the present invention.

An embodiment 35 is manufactured in the same manner as that of the embodiment 19 except a point that a depression is formed in a part of a complex metal plate 3503 of a metal core substrate 3502 mounting a semiconductor part 3501 thereon, and the semiconductor part 3501 is mounted in the depression, as shown in FIG. 35.

In accordance with the structure of the present embodiment, it is possible to increase an accuracy of mounting position of the semiconductor, and it is possible to obtain an effect of improving a heat radiation achieved by reducing a distance between the semiconductor part and the complex metal plate.

As described in the embodiment 1, when processing a plurality of insulating layers and wiring layers in a lump in forming the heat radiating via hole, it is possible to omit the counter sinking process 108 in the step (c), so that it is possible to reduce a number of the steps so as to reduce a cost. The structure of the end surface of the heat radiating via hole at this time is shown in FIG. 45B, and the structure of the end surface of the heat radiating via hole in accordance with the step described in FIG. 1 is shown in FIG. 45A.

Embodiment 36

Figure 36:
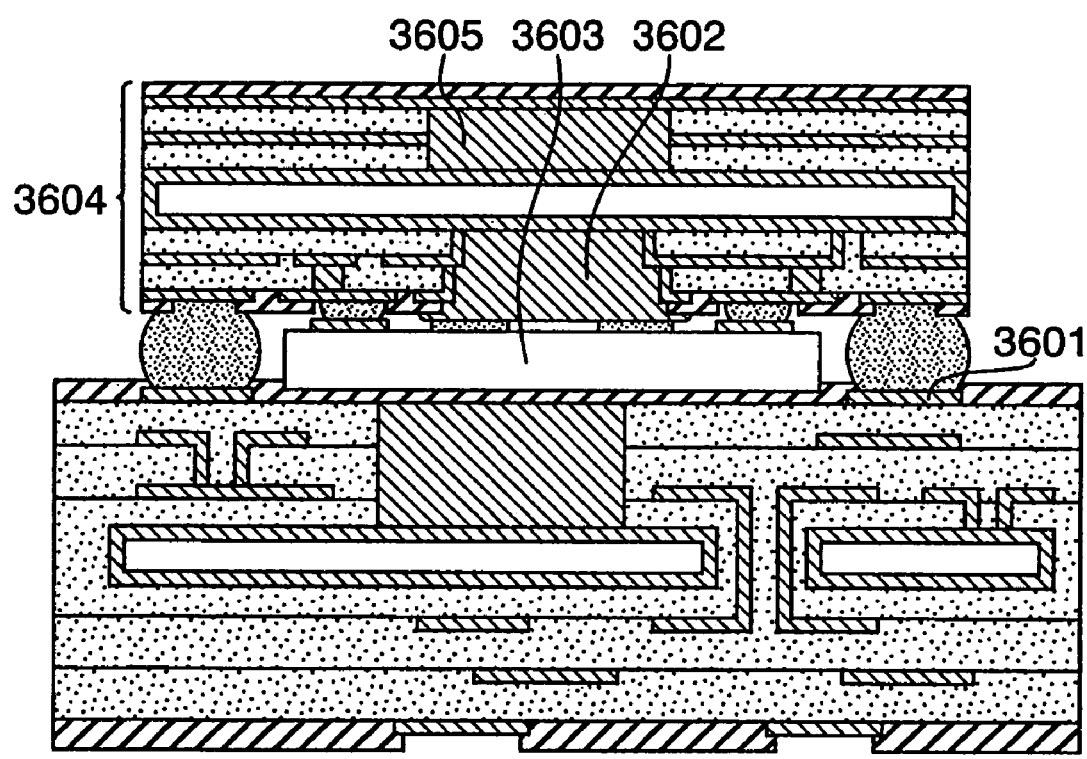
FIG. 36 is a view of a cross sectional structure of the electronic substrate used in the electronic apparatus in accordance with the present invention.

An embodiment 36 is manufactured in the same manner as that of the embodiment 19 except a point that a semiconductor part 3603 is mounted to a metal core substrate 3604 via an electrode 3601 and a heat radiating electrode 3602, and a heat radiating electrode 3605 connected to an internal layer metal plate is provided on a back surface of a semiconductor mounting surface via a heat radiating via hole, as shown in FIG. 36.

In accordance with the structure of the present embodiment, since it is possible to diffuse a heat via the heat radiating electrode, a more excellent cooling capacity can be added.

As described in the embodiment 1, when processing a plurality of insulating layers and wiring layers in a lump in forming the heat radiating via hole, it is possible to omit the counter sinking process 108 in the step (c), so that it is possible to reduce a number of the steps so as to reduce a cost. The structure of the end surface of the heat radiating via hole at this time is shown in FIG. 45B, and the structure of the end surface of the heat radiating via hole in accordance with the step described in FIG. 1 is shown in FIG. 45A.

Embodiment 37

Figure 37:
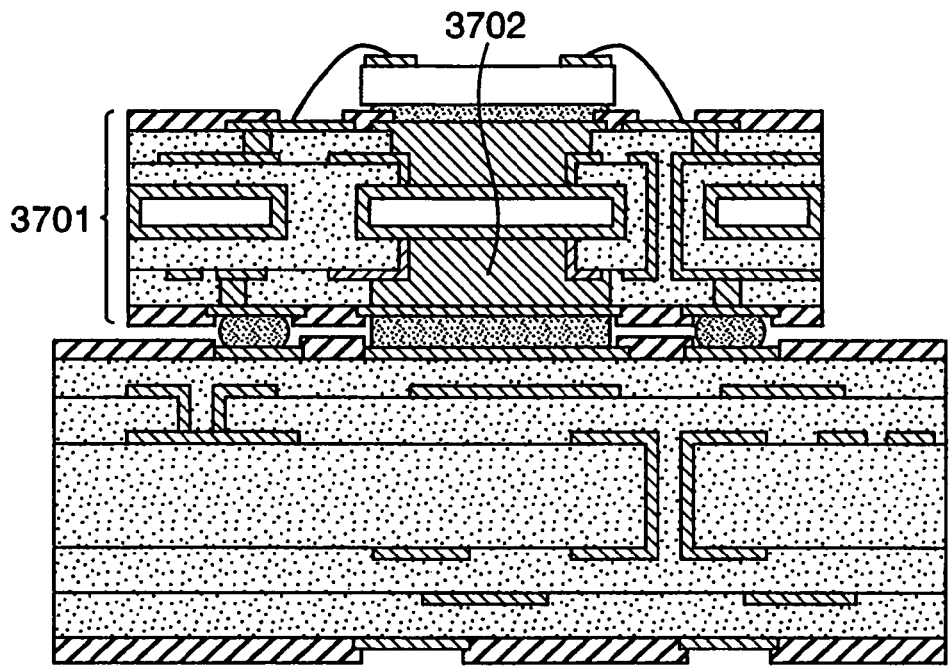
FIG. 37 is a view of a cross sectional structure of the electronic substrate used in the electronic apparatus in accordance with the present invention.

An embodiment 37 is the same as the embodiment 33 except a point that a portion 3706 in which the copper plating is charged into the heat radiating via hole is provided on a back surface of a semiconductor mounting surface in a metal core substrate 3701, as shown in FIG. 37. Accordingly, it is possible to further efficiently diffuse the heat.

As described in the embodiment 1, when processing a plurality of insulating layers and wiring layers in a lump in forming the heat radiating via hole, it is possible to omit the counter sinking process 108 in the step (c), so that it is possible to reduce a number of the steps so as to reduce a cost. The structure of the end surface of the heat radiating via hole at this time is shown in FIG. 45B, and the structure of the end surface of the heat radiating via hole in accordance with the step described in FIG. 1 is shown in FIG. 45A.

Embodiment 38

Figure 38:
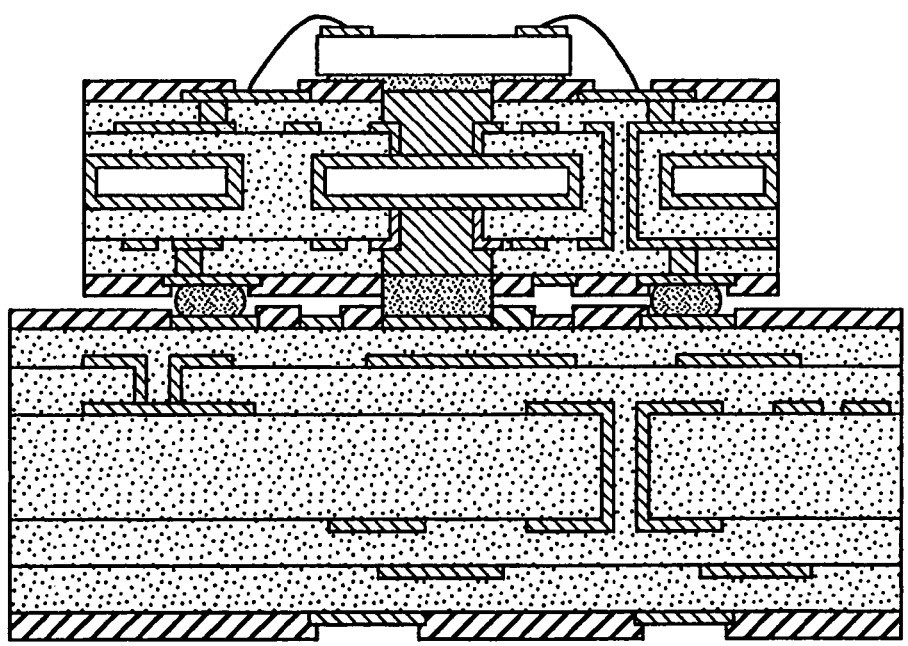
FIG. 38 is a view of a cross sectional structure of the electronic substrate used in the electronic apparatus in accordance with the present invention.

An embodiment 38 is the same as the embodiment 37 except a point that the heat radiating via hole is made smaller than the chip size, as shown in FIG. 38. In accordance with the structure of the present embodiment, it is possible to also apply the inner layer wiring to the area immediately below the chip, it is possible to increase a freedom of wiring pattern design while the heat radiating property is slightly reduced, and it is possible to reduce the size of the metal core substrate.

As described in the embodiment 1, when processing a plurality of insulating layers and wiring layers in a lump in forming the heat radiating via hole, it is possible to omit the counter sinking process 108 in the step (c), so that it is possible to reduce a number of the steps so as to reduce a cost. The structure of the end surface of the heat radiating via hole at this time is shown in FIG. 45B, and the structure of the end surface of the heat radiating via hole in accordance with the step described in FIG. 1 is shown in FIG. 45A.

Embodiment 39

Figure 39:
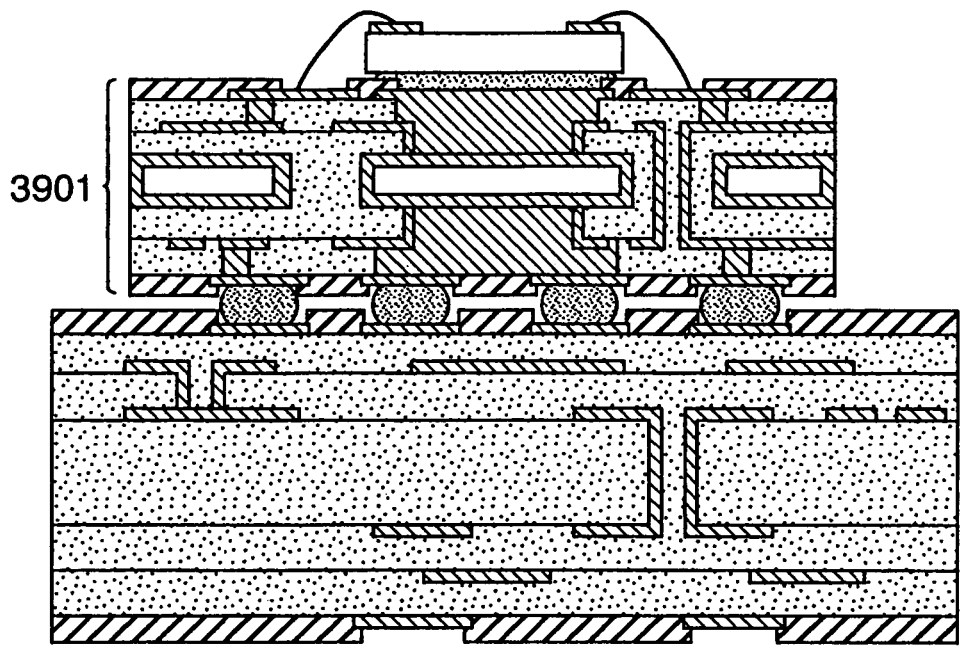
FIG. 39 is a view of a cross sectional structure of the electronic substrate used in the electronic apparatus in accordance with the present invention.

An embodiment 39 is the same as the embodiment 37 except a point that a heat radiating electrode having substantially the same as a diameter of an electrode for an electric connection is formed on s surface of a copper plating charged portion in a heat radiating via hole in a back surface side of a semiconductor mounting surface of a metal core substrate 3901, by a solder resist, and a nickel or a gold plating is applied for soldering and solder bonded to the main substrate, as shown in FIG. 39. In accordance with the present embodiment, a solder bonding property is improved.

As described in the embodiment 1, when processing a plurality of insulating layers and wiring layers in a lump in forming the heat radiating via hole, it is possible to omit the counter sinking process 108 in the step (c), so that it is possible to reduce a number of the steps so as to reduce a cost. The structure of the end surface of the heat radiating via hole at this time is shown in FIG. 45B, and the structure of the end surface of the heat radiating via hole in accordance with the step described in FIG. 1 is shown in FIG. 45A.

Embodiment 40

An embodiment 40 is the same as the embodiment 37 except a point that a main substrate to which a metal core substrate A 4001 is connected is also a metal core substrate B 4002 in which the heat radiating via holes are formed, and these radiating via holes are solder bonded to each other, as shown in FIG. 40. In accordance with the present embodiment, a heat radiating property to the main substrate and a heat dissipation property from the main substrate are improved.

As described in the embodiment 1, when processing a plurality of insulating layers and wiring layers in a lump in forming the heat radiating via hole, it is possible to omit the counter sinking process 108 in the step (c), so that it is possible to reduce a number of the steps so as to reduce a cost. The structure of the end surface of the heat radiating via hole at this time is shown in FIG. 45B, and the structure of the end surface of the heat radiating via hole in accordance with the step described in FIG. 1 is shown in FIG. 45A.

Embodiment 41

An embodiment 41 is the same as the embodiment 39 except a point that a main substrate to which a metal core substrate A 4101 is connected is also a metal core substrate B 4102 in which the heat radiating via holes are formed, and these radiating via holes are solder bonded to each other, as shown in FIG. 41. In accordance with the present embodiment, a heat radiating property to the main substrate and a heat dissipation property from the main substrate are improved.

As described in the embodiment 1, when processing a plurality of insulating layers and wiring layers in a lump in forming the heat radiating via hole, it is possible to omit the counter sinking process 108 in the step (c), so that it is possible to reduce a number of the steps so as to reduce a cost. The structure of the end surface of the heat radiating via hole at this time is shown in FIG. 45B, and the structure of the end surface of the heat radiating via hole in accordance with the step described in FIG. 1 is shown in FIG. 45A.

Embodiment 42

Figure 42:
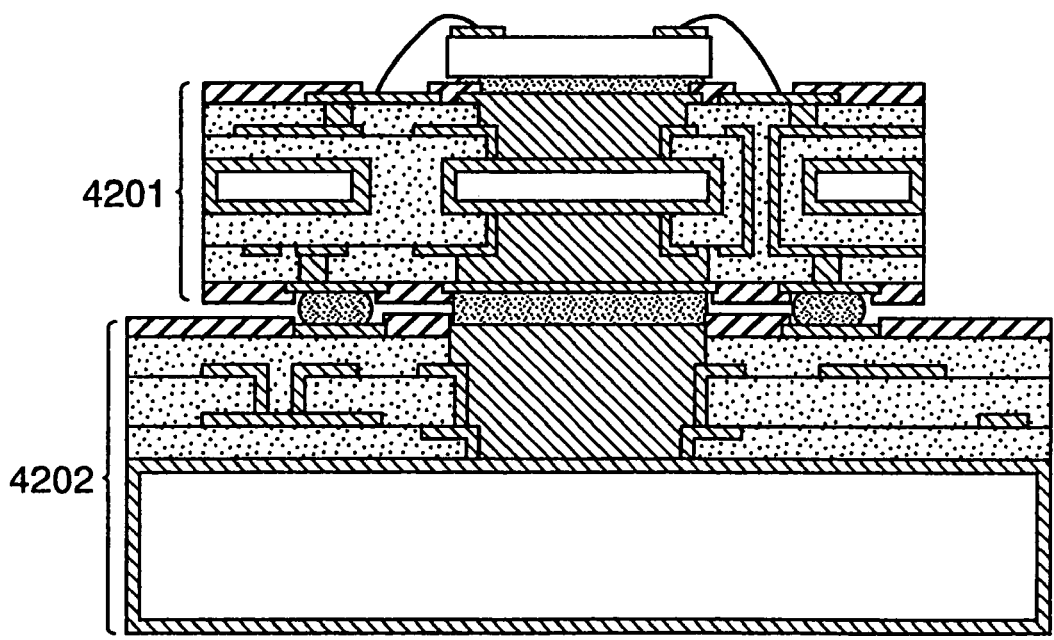
FIG. 42 is a view of a cross sectional structure of the electronic substrate used in the electronic apparatus in accordance with the present invention.

An embodiment 42 is the same as the embodiment 37 except a point that a main substrate to which a metal core substrate A 4201 is connected is a metal core substrate B 4202 in which the heat radiating via holes are formed, and these radiating via holes are solder bonded to each other, as shown in FIG. 42. In accordance with the present embodiment, a heat radiating property to the main substrate and a heat dissipation property from the main substrate are improved.

As described in the embodiment 1, when processing a plurality of insulating layers and wiring layers in a lump in forming the heat radiating via hole, it is possible to omit the counter sinking process 108 in the step (c), so that it is possible to reduce a number of the steps so as to reduce a cost. The structure of the end surface of the heat radiating via hole at this time is shown in FIG. 45B, and the structure of the end surface of the heat radiating via hole in accordance with the step described in FIG. 1 is shown in FIG. 45A.

Embodiment 43

Figure 43:
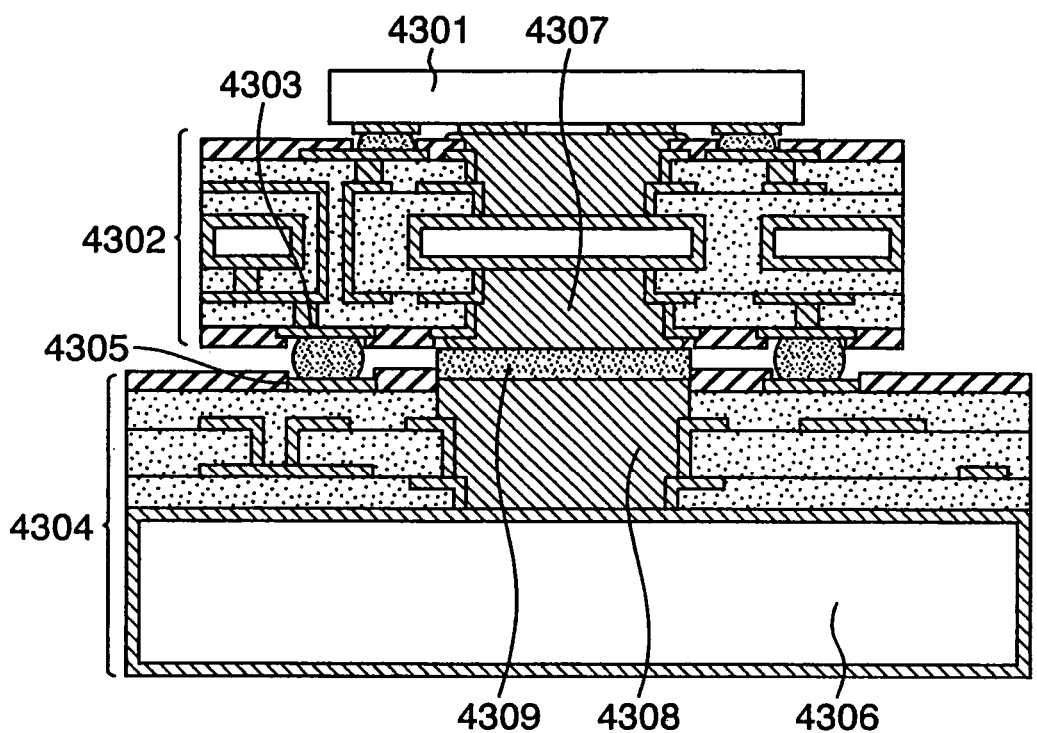
FIG. 43 is a view of a cross sectional structure of the electronic substrate used in the electronic apparatus in accordance with the present invention.

An embodiment 43 is manufactured in the same manner as that of the embodiment 19 except a point of connecting and mounting between an electrode A 4303 of a metal core substrate A 4302 mounting a semiconductor part 4301 thereon and an electrode B4305 formed on a metal base substrate B 4304, and between a heat radiating electrode A 4307 connected to a metal plate 4306 corresponding to a base of a metal core substrate A and a heat radiating electrode B 4308 provided in a metal base substrate B, via a solder 4309, as shown in FIG. 43.

In accordance with the structure of the present embodiment, in addition to an improvement of heat resistance and heat radiating property to the main substrate, the heat radiating property from the main substrate is improved.

As described in the embodiment 1, when processing a plurality of insulating layers and wiring layers in a lump in forming the heat radiating via hole, it is possible to omit the counter sinking process 108 in the step (c), so that it is possible to reduce a number of the steps so as to reduce a cost. The structure of the end surface of the heat radiating via hole at this time is shown in FIG. 45B, and the structure of the end surface of the heat radiating via hole in accordance with the step described in FIG. 1 is shown in FIG. 45A.

Embodiment 44

Figure 44:
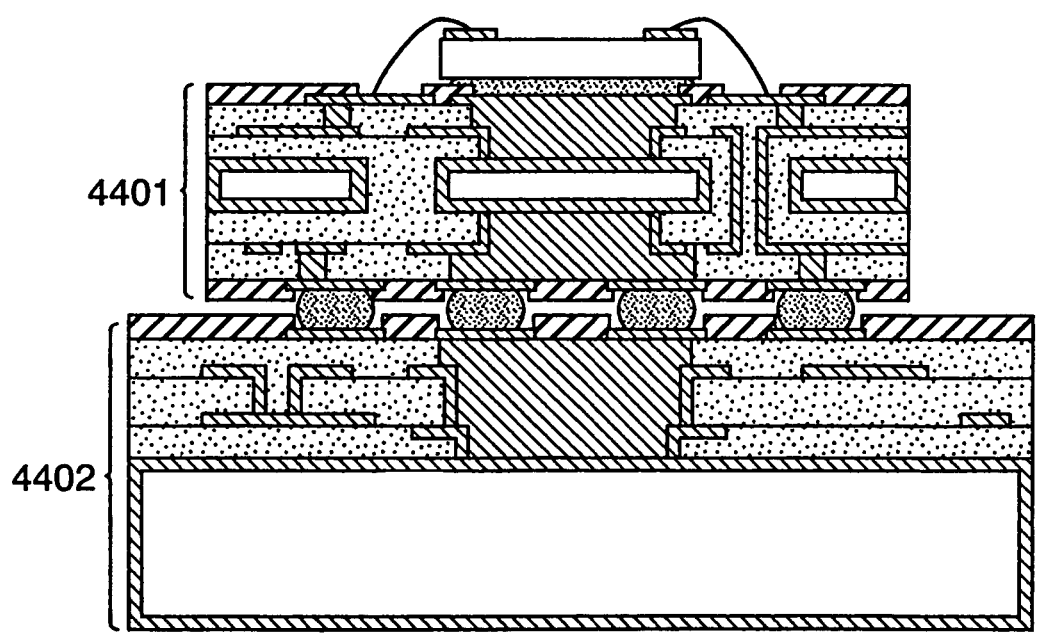
FIG. 44 is a view of a cross sectional structure of the electronic substrate used in the electronic apparatus in accordance with the present invention.

An embodiment 44 is the same as the embodiment 39 except a point that a main substrate to which a metal core substrate A 4401 is connected is also a metal base substrate B 4402 in which the heat radiating via holes are formed, and these radiating via holes are solder bonded to each other, as shown in FIG. 44. In accordance with the present embodiment, a heat radiating property to the main substrate and a heat dissipation property from the main substrate are improved.

As described in the embodiment 1, when processing a plurality of insulating layers and wiring layers in a lump in forming the heat radiating via hole, it is possible to omit the counter sinking process 108 in the step (c), so that it is possible to reduce a number of the steps so as to reduce a cost. The structure of the end surface of the heat radiating via hole at this time is shown in FIG. 45B, and the structure of the end surface of the heat radiating via hole in accordance with the step described in FIG. 1 is shown in FIG. 45A.

In accordance with the present invention, it is possible to provide the electronic apparatus having a high radiating property.

It should be further understood by those skilled in the art that the foregoing description has been made on embodiments of the invention and that various changes and modifications may be made in the invention without departing from the spirit of the invention and the scope of the appended claims.

The invention claimed is:

1. An electronic apparatus comprising:
a metal core substrate having a first surface on which a first electrode is formed and a second surface opposite to the first surface, the metal core substrate is provided with a core member interposed between the first surface and the second surface, a first wiring layer constituted by an insulating layer formed on said core member at a side of the first surface and a conductive layer connected to the first electrode, and a second wiring layer constituted by an insulating layer formed on said core member at a side of the second surface and a conductive layer connected to a second electrode formed on the second surface of the metal core substrate;
an electronic part having a first main surface on which a terminal is formed and a second main surface opposite to the first main surface; and
a printed circuit board having a first side on which a third electrode soldered to the second electrode of the metal core substrate is formed and a second side opposite to the first side, a metal plate is provided at the second side, wherein:
the core member has a window filled with an insulating material,
the metal core substrate has a first via hole formed in the first surface of the metal core substrate and exposing the core member, a second via hole formed in the second surface of the metal core substrate and exposing the core member, and a through hole extended through the insulating material filled in the window of the core member and electrically connecting the conductive layer of the first wiring layer and the conductive layer of the second wiring layer formed on the second surface of the metal core substrate,
the electronic part is disposed in the first via hole so that the second main surface is in contact with a surface of the core member exposed by the first via hole and the terminal is connected to the first electrode by a bonding wire,
a first heat radiating electrode is provided in the second via hole to be in contact with another surface of the core member exposed by the second via hole,
a second heat radiating electrode is provided in the printed circuit board and extended between the first side and the second side of the printed circuit board, and
the first heat radiating electrode is connected to the second heat radiating electrode via a solder so that heat generated by the electronic part is radiated through the core member, the first heating radiating electrode, the solder, and the second heat radiating electrode in this order toward the metal plate.

2. An electronic apparatus according to claim 1, wherein the metal plate provided at the second side of the printed circuit board is formed of a material selected from a group consisting of an iron series alloy containing at least any one of nickel, chrome, cobalt and aluminum; an iron series composite material obtained by applying a copper clad to the iron series alloy; tungsten; copper; molybdenum; tantalum; nickel; and aluminum.

3. An electronic apparatus according to claim 1, wherein the second heat radiating electrode is formed of a solder charged in a via hole which is formed in the printed circuit board and extended between the first side and the second side thereof.

4. An electronic apparatus according to claim 1, wherein the second heating radiating electrode is formed of a solder or a copper provided in the second via hole formed in the metal core substrate.

5. An electronic apparatus according to claim 1, wherein the core member is a metal plate to which a copper plating is applied.

* * * * *